United States Patent
Cho et al.

(10) Patent No.: US 11,502,012 B2
(45) Date of Patent: Nov. 15, 2022

(54) SEMICONDUCTOR PACKAGES AND METHODS OF MANUFACTURING THEREOF

(71) Applicant: Infineon Technologies AG, Neubiberg (DE)

(72) Inventors: Eung San Cho, Torrance, CA (US); Tomasz Naeve, Finkenstein (AT); Petteri Palm, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/082,643

(22) Filed: Oct. 28, 2020

(65) Prior Publication Data

US 2021/0233823 A1 Jul. 29, 2021

Related U.S. Application Data

(63) Continuation-in-part of application No. 16/774,357, filed on Jan. 28, 2020.

(51) Int. Cl.
 *H01L 23/14* (2006.01)
 *H01L 23/498* (2006.01)
 *H01L 23/482* (2006.01)

(52) U.S. Cl.
 CPC ........ *H01L 23/142* (2013.01); *H01L 23/4827* (2013.01); *H01L 23/49827* (2013.01)

(58) Field of Classification Search
 None
 See application file for complete search history.

(56) References Cited

U.S. PATENT DOCUMENTS

| | | |
|---|---|---|
| 4,646,129 A | 2/1987 | Yerman et al. |
| 7,271,470 B1 | 9/2007 | Otremba |
| 7,315,081 B2 | 1/2008 | Standing |
| 7,757,392 B2 | 7/2010 | Otremba |
| 10,170,428 B2 | 1/2019 | Pietambaram et al. |
| 10,192,795 B2 | 1/2019 | Mori |
| 10,617,012 B2 | 4/2020 | Zluc et al. |
| 11,043,409 B2 | 6/2021 | Palm |
| 11,069,667 B2 | 7/2021 | Gani |
| 2001/0048156 A1 | 12/2001 | Fukuizumi |
| 2006/0214186 A1 | 9/2006 | Hamidi et al. |

(Continued)

FOREIGN PATENT DOCUMENTS

| | | |
|---|---|---|
| CN | 109727969 A | 5/2019 |
| DE | 102017105330 A1 | 9/2018 |
| EP | 3376539 A1 | 9/2018 |

OTHER PUBLICATIONS

Peinhopf, Wolfgang, "Cooling concepts for CanPAK(TM)* package", Infineon Technologies AG, Edition Feb. 28, 2011, Actual Release: Rev.1.0, accessed online at https://www.infineon.com/dgdl/Infineon-CanPAK_cooling_concepts-AN-v01_00-EN.pdf?fileId=db3a30432e5d3808012e703377015fe9 on Jan. 28, 2020.

*Primary Examiner* — Telly D Green
(74) *Attorney, Agent, or Firm* — Murphy, Bilak & Homiller, PLLC

(57) ABSTRACT

Semiconductor packages described herein include a thermal capacitor designed to absorb transient heat pulses from a power semiconductor die and subsequently release the transient heat pulses to a surrounding environment, and/or a recessed pad feature. Corresponding methods of production are also described.

8 Claims, 26 Drawing Sheets

(56) References Cited

U.S. PATENT DOCUMENTS

| | | |
|---|---|---|
| 2007/0266558 A1 | 11/2007 | Otremba |
| 2010/0044842 A1 | 2/2010 | Mengel et al. |
| 2012/0235293 A1* | 9/2012 | Jones .................... H01L 23/473 |
| | | 257/E23.098 |
| 2013/0292684 A1 | 11/2013 | Nikitin et al. |
| 2014/0110788 A1 | 4/2014 | Cho et al. |
| 2014/0217576 A1* | 8/2014 | Im ....................... H01L 23/3736 |
| | | 257/720 |
| 2015/0001699 A1 | 1/2015 | Funatsu et al. |
| 2015/0255380 A1 | 9/2015 | Chen |
| 2017/0221798 A1 | 8/2017 | Cho |
| 2017/0287886 A1 | 10/2017 | Gani |
| 2018/0054120 A1 | 2/2018 | Cho |
| 2018/0269146 A1 | 9/2018 | Palm |
| 2019/0273017 A1 | 9/2019 | Palm |
| 2020/0135619 A1 | 4/2020 | Dinkel et al. |

\* cited by examiner

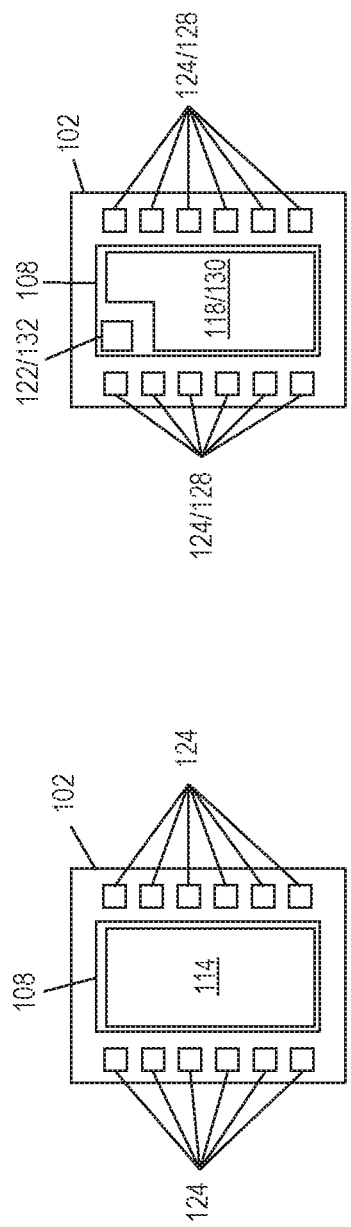
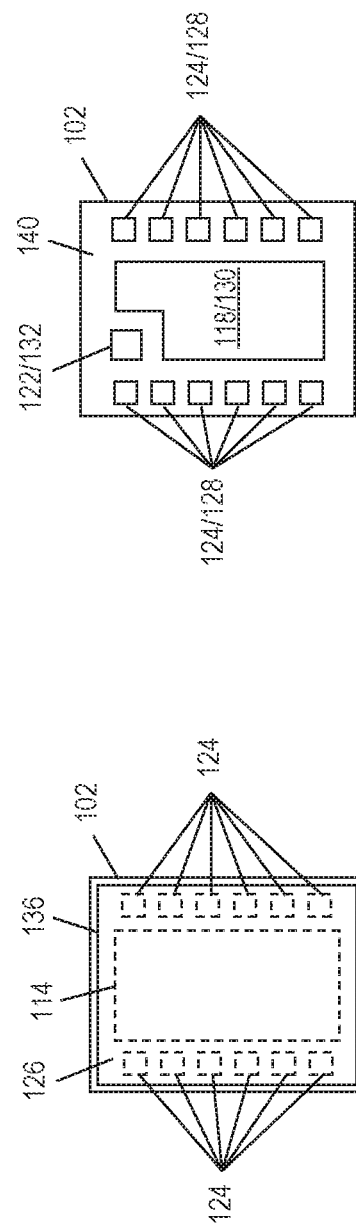
FIGURE 3A
FIGURE 3B

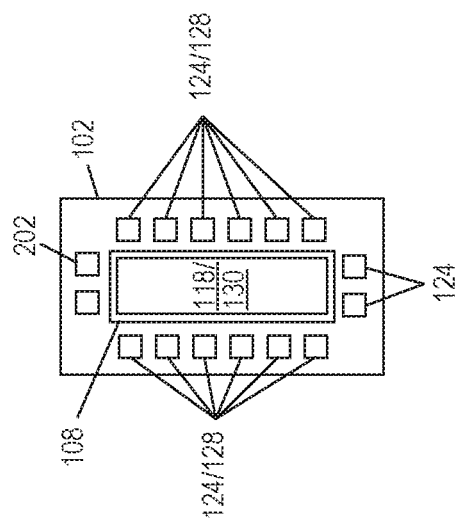
*FIGURE 4A*
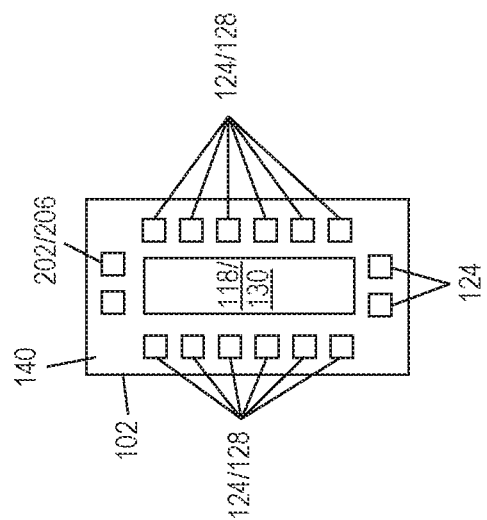
*FIGURE 4B*
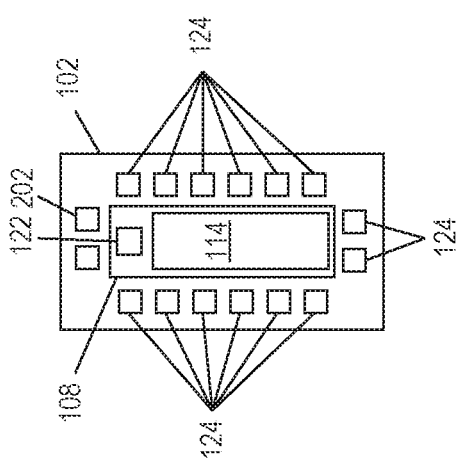
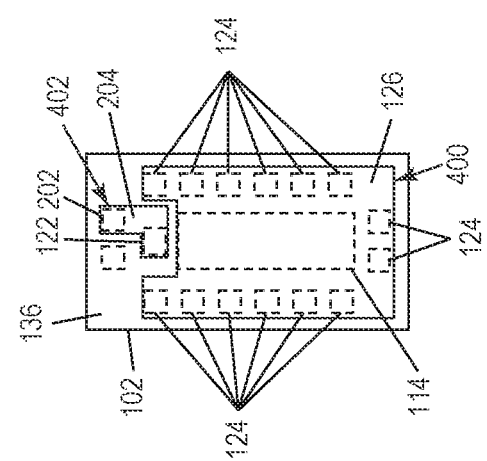

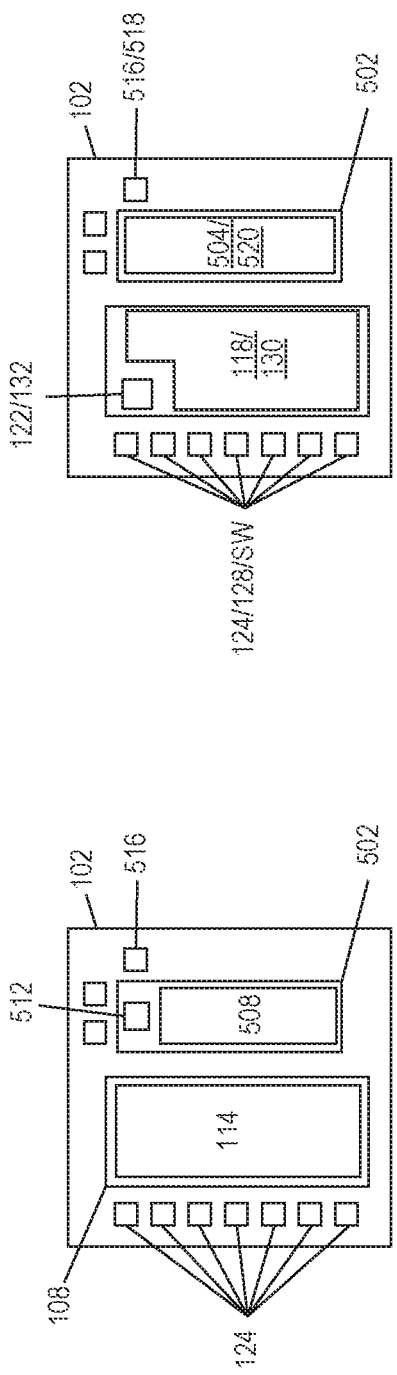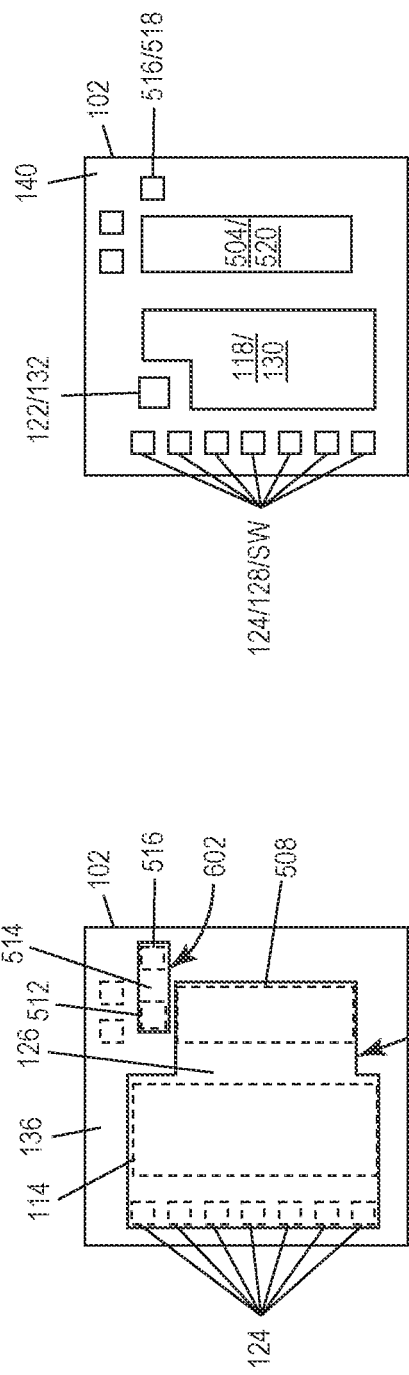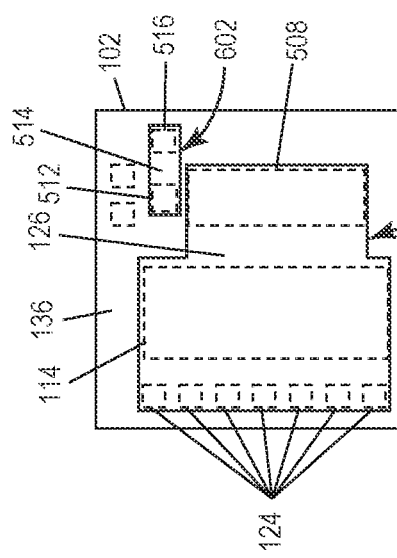

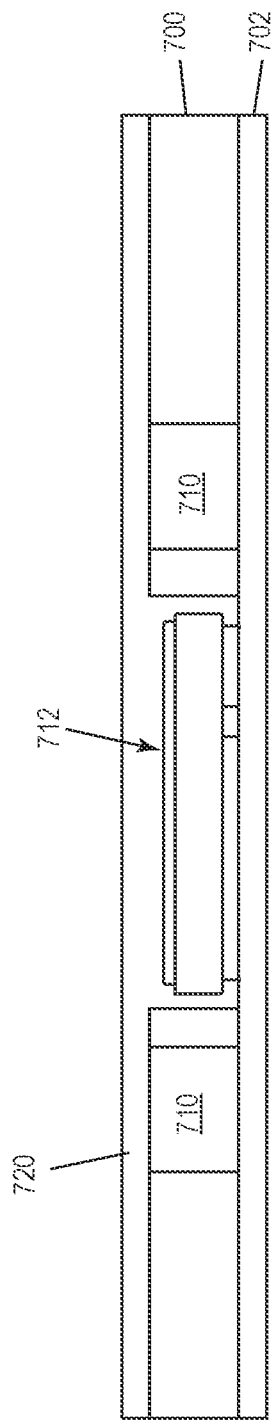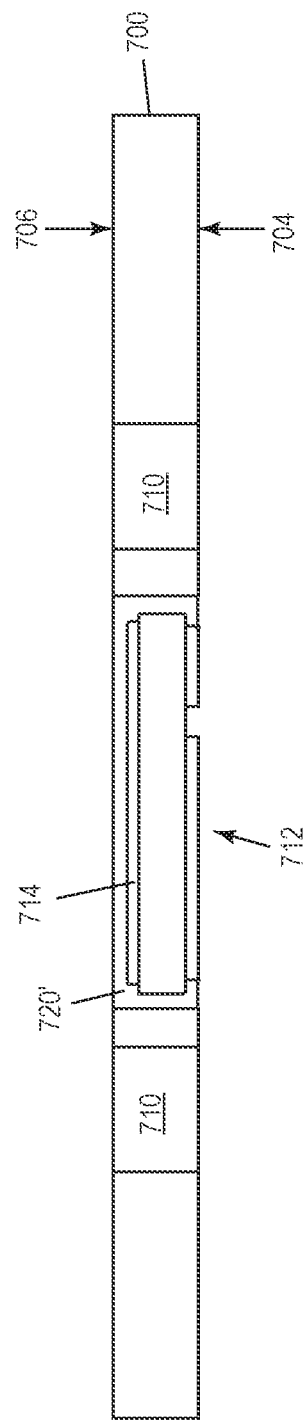

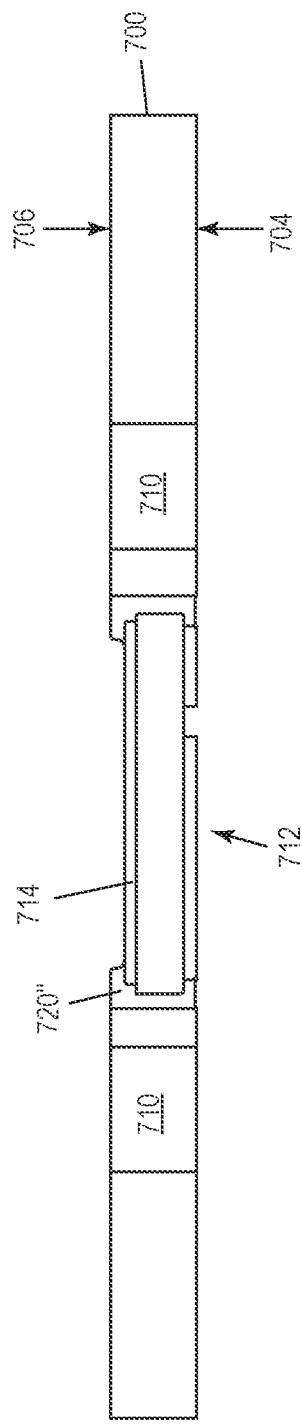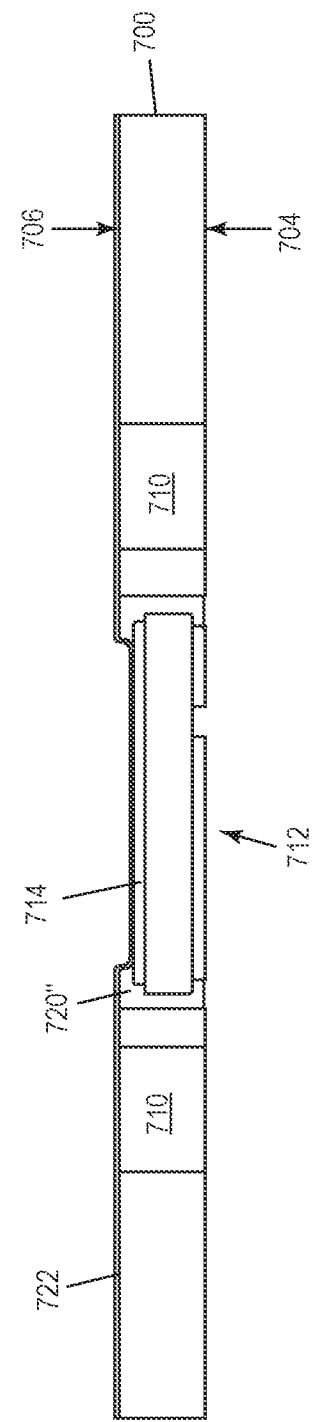

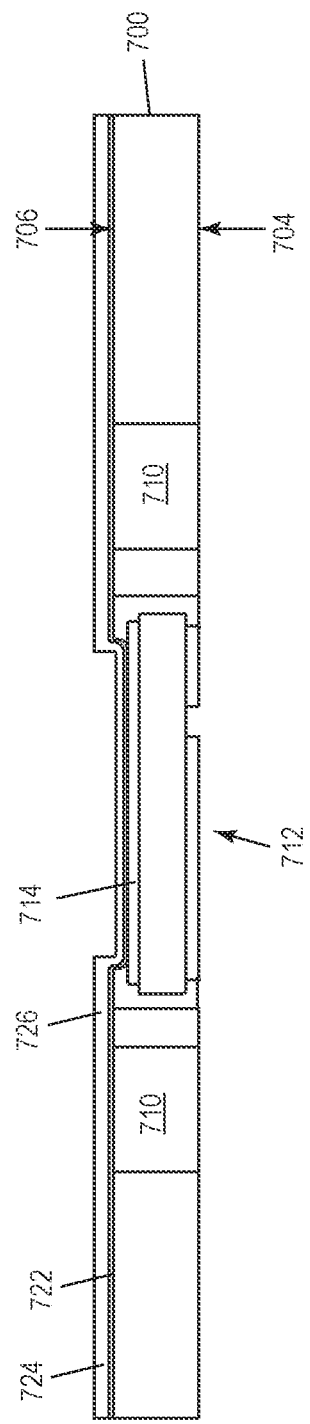
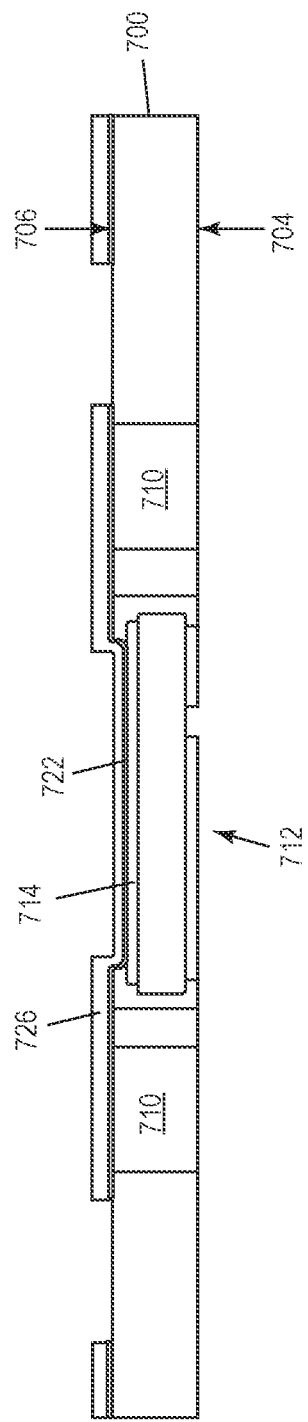

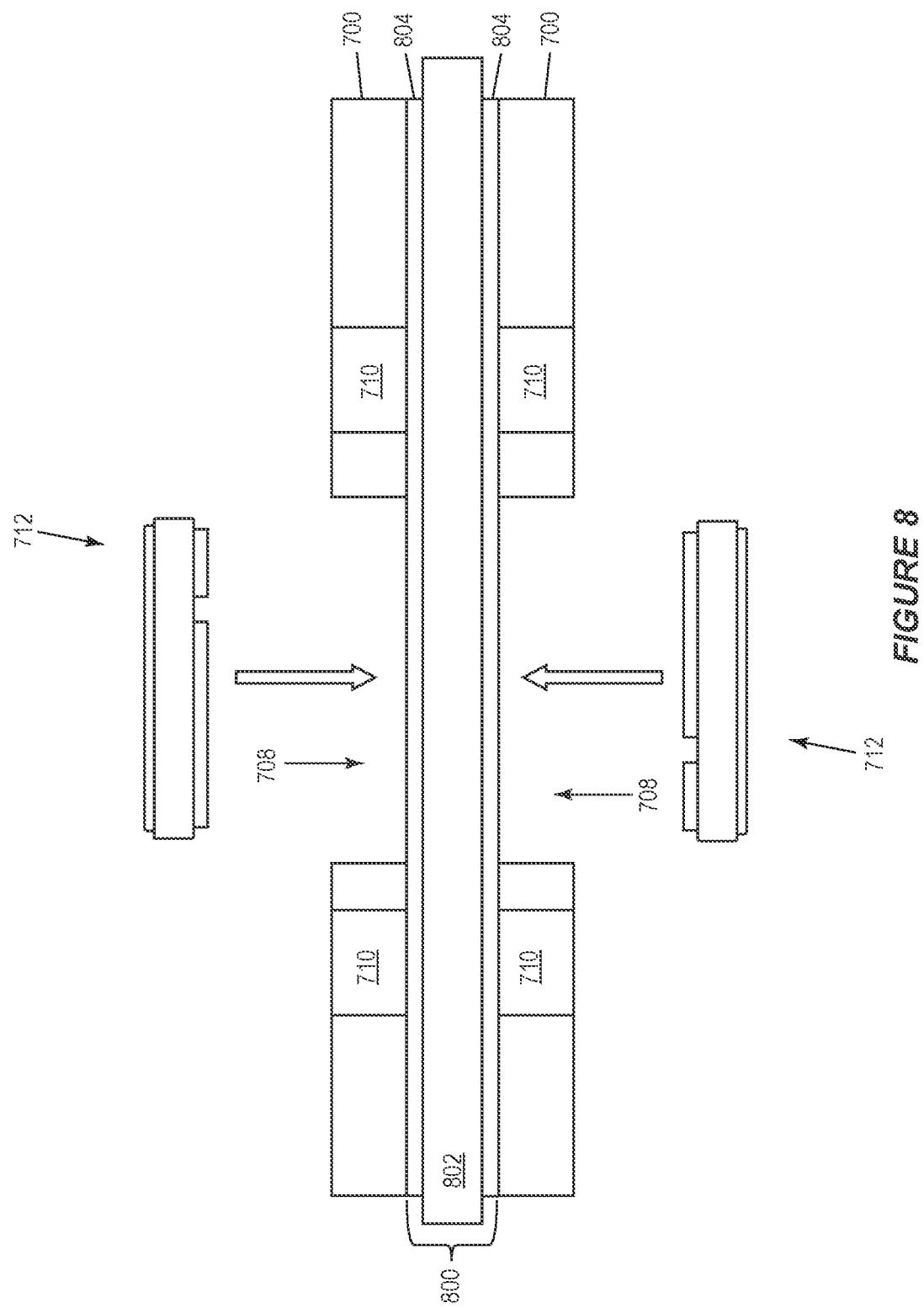

SEMICONDUCTOR PACKAGES AND METHODS OF MANUFACTURING THEREOF

BACKGROUND

Cooling capability is a disadvantage for SMD (surface mount device) based power electronics. However, SMD-based systems provide high efficiency and are thus widely used. Some power SMD package solutions provide a low thermal resistance to the top and bottom sides of the package and no longer use bond wire or clip interconnects, but instead use solder bumps for source and gate connections. The drain connection is formed by a plated copper can (lid) which is bonded to the drain side of the power semiconductor die. The can/lid provides a low thermal resistance to the top side of the package and is well-suited for cooling through the top side of the package, thereby providing a double-sided cooling solution.

However, the can/lid approach requires a relatively large gate pad size which reduces the active area of the power semiconductor device and therefore increases die cost and lowers overall efficiency. In addition, the can/lid approach does not easily support thin semiconductor dies (e.g. 40 μm to 60 μm thick or even thinner) due to bond line thickness issues which arise when thermal material creeps up the sidewall of a thin power semiconductor die. Excessive creepage may result in electrical problems, which is difficult to avoid in the case of thin semiconductor dies.

Thus, there is a need for an improved SMD-based power semiconductor package and related methods of manufacture.

SUMMARY

According to an embodiment of a semiconductor package, the semiconductor package comprises: an insulating substrate having a first main side and a second main side opposite the first main side; a power semiconductor die embedded in, and thinner than or a same thickness as, the insulating substrate, the power semiconductor die comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; electrically conductive first vias extending through the insulating substrate in a periphery region which laterally surrounds the power semiconductor die; a first metallization connecting the first load terminal bond pad of the power semiconductor die to the first vias at the first main side of the insulating substrate; solderable first contact pads at the second main side of the insulating substrate and formed by the first vias; and a solderable second contact pad at the second main side of the insulating substrate and formed by the second load terminal bond pad of the power semiconductor die.

According to an embodiment of a method of producing a semiconductor package, the method comprises: embedding a power semiconductor die in an insulating substrate, the insulating substrate having a first main side and a second main side opposite the first main side, the power semiconductor die being thinner than or a same thickness as the insulating substrate and comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; and forming a first metallization at the first main side of the insulating substrate, the first metallization connecting the first load terminal bond pad of the power semiconductor die to electrically conductive first vias which extend through the insulating substrate in a periphery region which laterally surrounds the power semiconductor die, wherein the first vias form solderable first contact pads at the second main side of the insulating substrate, wherein the second load terminal bond pad of the power semiconductor die forms a solderable second contact pad at the second main side of the insulating substrate.

According to an embodiment of a method of producing a plurality of semiconductor packages, the method comprises: adhering a core insulating panel having a plurality of openings to a temporary bonding tape at a second main side of the core insulating panel opposite a first main side; inserting a power semiconductor die in each opening of the core insulating panel, each power semiconductor die being thinner than or a same thickness as the core insulating panel and comprising a first load terminal bond pad at a first side which faces a same direction as the first main side of the core insulating panel, a second load terminal bond pad at a second side which faces a same direction as the second main side of the core insulating panel, and a control terminal bond pad at the first side or the second side, wherein each power semiconductor die adheres to the temporary bonding tape at the second side of the power semiconductor die; forming a first metallization layer at the first main side of the core insulating panel, the first metallization layer being patterned into a plurality of first metallizations, each first metallization being associated with one of the power semiconductor dies and connecting the first load terminal bond pad of the power semiconductor die to respective electrically conductive first vias which extend through the core insulating panel in a periphery region which laterally surrounds the power semiconductor die; and singulating the core insulating panel into a plurality of packages, wherein for each package the first vias included in the package form solderable first contact pads at the second main side of the singulated core insulating panel and the second load terminal bond pad of the power semiconductor die included in the package forms a solderable second contact pad at the second main side of the singulated core insulating panel.

According to another embodiment of a semiconductor package, the semiconductor package comprises: a substrate having a first main surface, a second main surface opposite the first main surface, an electrically insulating core between the first and second main surfaces, and an electrically conductive first via extending through a periphery region of the core, the periphery region defining an opening in the core; a power semiconductor die embedded in the opening in the core, the power semiconductor die being thinner than or a same thickness as the core, the power semiconductor die comprising a first load terminal bond pad at a first side which faces a same direction as the first main surface of the substrate, a second load terminal bond pad at a second side which faces a same direction as the second main surface of the substrate, and a control terminal bond pad at the first side or the second side; a plated first contact pad at the second main surface of the substrate and provided by the first via; a plated second contact pad at the second main surface of the substrate and provided by the second load terminal bond pad of the power semiconductor die; and a thermal capacitor attached to the first main surface of the substrate, the thermal capacitor designed to absorb transient heat pulses from the power semiconductor die and subsequently release the transient heat pulses to a surrounding environment.

According to an embodiment a method of batch producing a plurality of semiconductor packages, the method comprises: aligning a first panel with a second panel, the first panel including a plurality of interconnected substrates with openings and a power semiconductor die embedded in each opening, the second panel comprising a plurality of interconnected thermal capacitors aligned with respective ones of the substrates; attaching each thermal capacitor to the corresponding substrate aligned with the thermal capacitor by an attach material applied to the substrates of the first panel and/or the thermal capacitors of the second panel; and after the attaching, cutting through regions of the first panel which interconnect the substrates and through regions of the second panel which interconnect the thermal capacitors to form individual packages, each individual package comprising a substrate, a power semiconductor die embedded in the substrate and a thermal capacitor attached to the substrate, the thermal capacitor being designed to absorb transient heat pulses from the power semiconductor die included in the same package as the thermal capacitor and subsequently release the transient heat pulses to a surrounding environment.

According to another embodiment of a semiconductor package, the semiconductor package comprises: an electrically insulating core having a first side, a second side opposite the first side and configured for mounting to another substrate, and an electrically conductive first via extending through a periphery region of the core, the periphery region defining an opening in the core, the core comprising glass fibres interwoven with epoxy material, the core having one or more regions at the second side where the glass fibres are exposed from the epoxy material; a power semiconductor die embedded in the opening in the core, the power semiconductor die being thinner than the core and comprising a first load terminal bond pad at a first side which faces a same direction as the first side of the core, a second load terminal bond pad at a second side which faces a same direction as the second side of the core, and a control terminal bond pad at the first side or the second side of the power semiconductor die; a resin filling the opening in the core and encasing the power semiconductor die; a plated first contact pad at the first side of the core and provided by the first via; a plated second contact pad at the second side of the core and provided by the first load terminal bond pad of the power semiconductor die; and a solder mask partly covering the one or more regions at the second side of the core where the glass fibres are exposed from the epoxy material.

According to another embodiment of a method of producing a semiconductor package, the method comprises: positioning an electrically insulating core with a first side of the core facing downward and a second side of the core facing upward, the second side configured for mounting to another substrate, wherein an electrically conductive first via extends through a periphery region of the core, the periphery region defining an opening in the core, wherein the core comprises glass fibres interwoven with epoxy material; placing a power semiconductor die in the opening in the core, the power semiconductor die being thinner than the core and comprising a first load terminal bond pad facing downward in the same direction as the first side of the core, and a second load terminal bond pad facing upward in the same direction as the second side of the core; at the second side of the core: filling the opening in the core with a resin that encases the power semiconductor die; reducing a thickness of the resin in a region overlying the second load terminal bond pad of the power semiconductor die; and after the reducing, thinning the resin to expose the first via and the second load terminal bond pad of the power semiconductor die, the thinning exposing the glass fibres from the epoxy material in one or more regions at the second side of the core; and partly covering, with a solder mask, the one or more regions at the second side of the core where the glass fibres are exposed from the epoxy material.

According to another embodiment of a method of producing a semiconductor package, the method comprises: positioning an electrically insulating core with a first side of the core facing upward and a second side of the core facing downward, the second side configured for mounting to another substrate, wherein an electrically conductive first via extends through a periphery region of the core, the periphery region defining an opening in the core, wherein the core comprises glass fibres interwoven with epoxy material; placing a power semiconductor die in the opening in the core, the power semiconductor die being thinner than the core and comprising a first load terminal bond pad facing upward in the same direction as the first side of the core, and a second load terminal bond pad facing downward in the same direction as the second side of the core; and at the first side of the core: filling the opening in the core with a resin that encases the power semiconductor die; thinning the resin; forming a mask on the thinned resin, the mask having a first opening aligned with the first via and a second opening aligned with the first load terminal bond pad of the power semiconductor die; etching the resin through the first opening to expose the first via and through the second opening to expose the first load terminal bond pad of the power semiconductor die.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIGS. 3A and 3B illustrate an embodiment of a method of producing the semiconductor package shown in FIG. 1.

FIGS. 4A and 4B illustrate an embodiment of a method of producing the semiconductor package shown in FIG. 2.

FIGS. 6A and 6B illustrate an embodiment of a method of producing the semiconductor package shown in FIG. 5.

FIGS. 7A through 7I illustrate respective cross-sectional views of an embodiment of a method of batch producing semiconductor package.

FIG. 8 illustrates a cross-sectional view of another embodiment of a method of batch producing semiconductor packages.

DETAILED DESCRIPTION

The embodiments described provide a semiconductor package having one or more solderable contact pads formed by at least one terminal bond pad of a power semiconductor die, and methods of manufacturing thereof. The semiconductor package has increased thermal dissipation, smaller form factor, provides direct pad contact between die and mounting surface, and provides gate terminal routing. The methods described herein are process-flow compatible with large panels typically used in PCB (printed circuit board) processing and provide lower cost scale. The package also has improved thermal performance at the package topside. Instead of solder between the die and topside metallization, the connection may be a direct copper-to-copper connection. The package footprint can be standardized between different die sizes, since the surface of the insulating substrate body of the package can be used to extend/rout the source/emitter (or drain/collector) and gate pad connections in the case of a power semiconductor transistor device.

Figure 1:
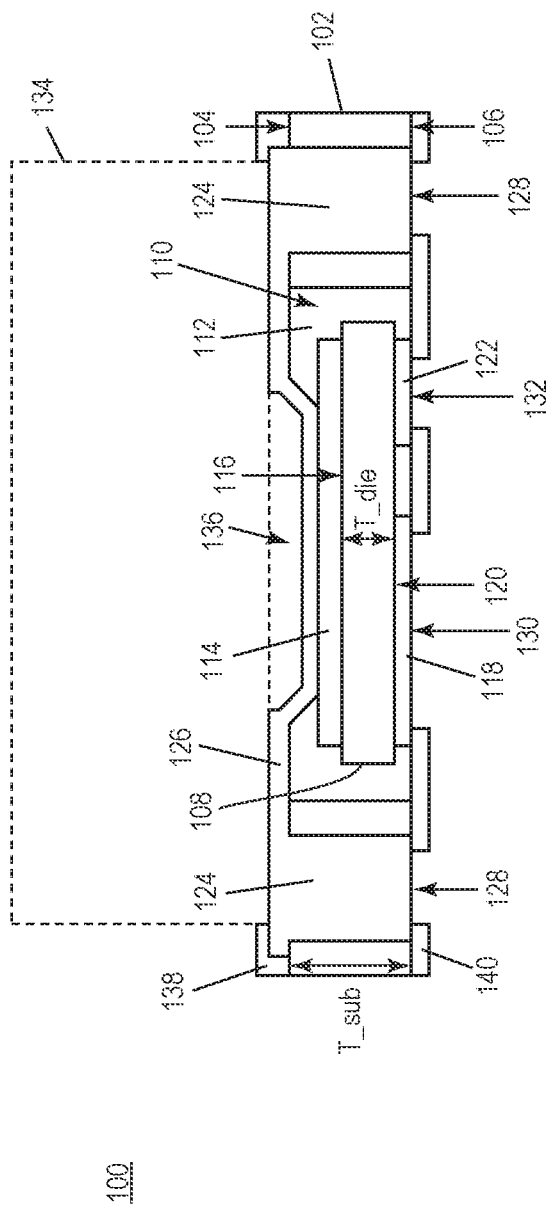
FIG. 1 illustrates a cross-sectional view of an embodiment of a semiconductor package.

FIG. 1 illustrates a cross-sectional view of an embodiment of a semiconductor package 100. The semiconductor package 100 includes an insulating substrate 102 having a first main side 104 and a second main side 106 opposite the first main side 104. The insulating substrate 102 may be a laminate such as a PCB substrate, etc. The package 100 also includes a power semiconductor die 108 embedded in, and thinner than or a same thickness as, the insulating substrate 102. That is, the thickness T_sub of the insulating substrate 102 is the same as or greater than the thickness T_die of the power semiconductor die 108, thereby eliminating bond line thickness issues associated with thin semiconductor dies. Accordingly, the power semiconductor die 108 embedded in the insulating substrate 102 may be relatively thin, e.g., T_die may be in a range of 40 μm to 60 μm or even less.

In one embodiment, the power semiconductor die 108 is positioned in an opening 110 in the insulating substrate 102 and the opening 110 is at least partly filled with an insulating material 112 such as an epoxy, resin, etc. The insulating substrate 102 with the opening 110 and the insulating material 112 that at least partly fills the opening 110 may be made of the same material or of different materials. For example, the insulating substrate 102 with the opening 110 may comprise glass fibres embedded in an epoxy and the insulating material 112 that at least partly fills the opening 110 may comprise a resin. In another example, both the insulating substrate 102 with the opening 110 and the insulating material 112 that at least partly fills the opening 110 may be a resin material. These are just a few examples for the composition of the insulating substrate 102 and insulating material 112, and still other material combinations are possible.

The power semiconductor die 108 embedded in the insulating substrate 102 has a first load terminal bond pad 114 at a first side 116 of the die 108 and which faces the same direction as the first main side 104 of the insulating substrate 102. The power semiconductor die 108 also has a second load terminal bond pad 118 at a second side 120 of the die 108 and which faces the same direction as the second main side 106 of the insulating substrate 102. According to the embodiment illustrated in FIG. 1, the power semiconductor die 108 further has a control terminal bond pad 122 at the second side 120 of the die 108.

The first load terminal bond pad 114 of the power semiconductor die 108 may be a drain terminal bond pad and the second load terminal bond pad 118 of the die 108 may be a source terminal bond pad, e.g., in the case of a power MOSFET (metal-oxide-semiconductor field-effect transistor) device, HEMT (high-electron mobility transistor) device, etc. The first load terminal bond pad 114 of the power semiconductor die 108 instead may be a collector terminal bond pad and the second load terminal bond pad 118 of the die 108 may be an emitter terminal bond pad, e.g., in the case of an IGBT (insulated-gate bipolar transistor) device. In each example, the control terminal bond pad 122 at the second side 120 of the power semiconductor die 108 may be a gate terminal bond pad.

Regardless of the type of power semiconductor die 108 embedded in the insulating substrate 102, the semiconductor package 100 also includes electrically conductive first vias 124 such as plated through holes, copper vias, metal blocks, etc. extending through the insulating substrate 102 in a periphery region which laterally surrounds the power semiconductor die 108. The semiconductor package 100 further includes a first metallization 126 such as a copper metallization connecting the first load terminal bond pad 114 of the power semiconductor die 108 to the first vias 124 at the first main side 104 of the insulating substrate 102.

In one embodiment, the first vias 124, the first metallization 126 and the first load terminal bond pad 114 of the power semiconductor die 108 each comprise copper. The second load terminal bond pad 118 and the control terminal bond pad 122 of the power semiconductor die 108 also may each comprise copper. Other electrically conductive materials may be used for the first vias 124, the first metallization 126 and the terminal bond pads 114, 118, 122 of the power semiconductor die 108. In general, any metal or metal compound such as Cu, NiPdAu, etc. may be used for the first load terminal bond pad 114 at the first side 116 of the power semiconductor die 108. For the terminal bond pads 118, 122 at the second side 120 of the power semiconductor die 108, the metal or metal compound used should be solderable, e.g., Cu. The term "solderable" as used herein means an adequate soldered joint can be made to that material. For example, the solderable contact pads described herein may include standard leaded or lead-free solder materials or alloys used in electronics manufacturing and containing at least one of the following materials: Sn, Pb, Sb, Bi, Ag, Cu, Zn, and/or In.

Solderable first contact pads 128 at the second main side 106 of the insulating substrate 102 are formed by the first vias 124 which extend through the insulating substrate 102. In one embodiment, standard pre-plated vias are used but made wide/large enough so that the first vias 124 have sufficient surface contact area for use as final/direct pads 128 at the second main side 106 of the insulating substrate 102.

In the example given above of the first load terminal bond pad 114 of the power semiconductor die 108 being a drain (or collector) terminal bond pad, this means that the first vias 124 can be used as final/direct pads 128 for providing the drain (or collector) connection at the second main side 106 of the insulating substrate 102. If the first load terminal bond pad 114 of the power semiconductor die 108 is instead a source (or emitter) terminal bond pad, the first vias 124 can be used as final/direct pads 128 for providing the source (or emitter) connection at the second main side 106 of the insulating substrate 102.

A solderable second contact pad 130 at the second main side 106 of the insulating substrate 102 is formed by the second load terminal bond pad 118 of the power semiconductor die 108, and a solderable third contact pad 132 at the second main side 106 of the insulating substrate 102 is formed by the control terminal bond pad 122 of the die 108 in FIG. 1. Accordingly, at least two terminal bond pads 118, 122 of the power semiconductor die 108 form some of the final I/O pads of the semiconductor package 100 according to the embodiment illustrated in FIG. 1, whereas the first vias 124 form additional final I/O pads of the package.

In one embodiment, at the second main side 106 of the insulating substrate 102, the solderable second contact pad 130 formed by the second load terminal bond pad 118 of the power semiconductor die 108 is coplanar with the solderable first contact pads 128 formed by the first vias 124. The solderable third contact pad 132 formed by the control terminal bond pad 122 of the power semiconductor die 108 may also be coplanar with the solderable first contact pads 128 formed by the first vias 124 at the second main side 106 of the insulating substrate 102.

All electrical connections for the power semiconductor die 108 are provided at the second main side 106 of the insulating substrate 102 in the form of respective solderable contact pads 128, 130, 132, giving the semiconductor package 100 an SMD configuration. The semiconductor package 100 may be cooled at the second main side 106 of the insulating substrate 102, e.g., through the board/substrate (not shown) to which the package 100 is to be mounted. A heat sink 134 may be attached to the first metallization 126 at the first main side 104 of the insulating substrate 102 to provide double-sided cooling. The heat sink 134 may be omitted and instead the first metallization 126 thickened at the first main side 104 of the insulating substrate 102 to provide double-sided cooling. In the case of single-sided cooling, the heat sink 134 is omitted and therefore illustrated as a dashed box in FIG. 1. Any gaps 136 between the heat sink 134 and the first metallization 126 at the first main side 104 of the insulating substrate 102 may be filled with a thermal interface material such as thermal grease, thermal glue, etc. The gap(s) 136 instead may be eliminated by covering part of the first metallization 126 at the first main side 104 of the insulating substrate 102 and increasing the thickness of the first metallization 126 where uncovered, e.g., by additional plating and/or ECD (electrochemical deposition) of Cu.

A first solder mask 138 may at least partly cover the first metallization 126 at the first main side 104 of the insulating substrate 102. In the case of single-sided cooling, the first solder mask 138 may completely cover the first metallization 126 at the first main side 104 of the insulating substrate 102. A second solder mask 140 may be provided at the second main side 106 of the insulating substrate 102 to define the exposed surface area of the respective solderable contact pads 128, 130, 132 provided at the second main side 106 of the insulating substrate 102 for surface mounting of the semiconductor package 100.

Figure 2:
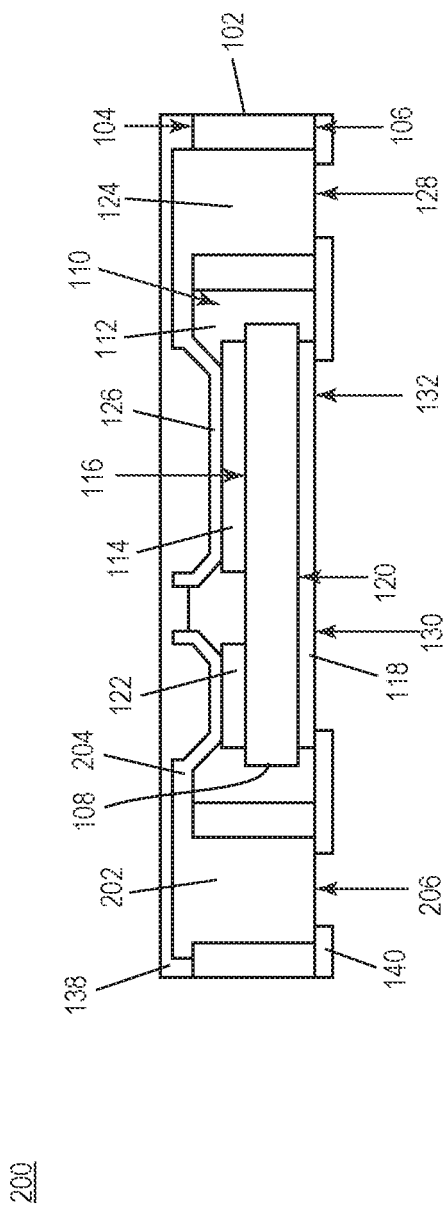
FIG. 2 illustrates a cross-sectional view of another embodiment of a semiconductor package.

FIG. 2 illustrates a cross-sectional view of another embodiment of a semiconductor package 200. The embodiment shown in FIG. 2 is similar to the embodiment shown in FIG. 1. Different, however, the control terminal bond pad 122 of the power semiconductor die 108 is at the first side 116 of the die 108 instead of the second side 120 in FIG. 2. To provide an electrical connection for the control terminal bond pad 122 of the power semiconductor die 108 at the second main side 106 of the insulating substrate 102, the semiconductor package 200 in FIG. 2 includes an electrically conductive second via 202 extending through the insulating substrate 102 in the periphery region and a second metallization 204 connecting the control terminal bond pad 122 of the power semiconductor die 108 to the second via 202 at the first main side 104 of the insulating substrate 102. The second metallization 204 at the first main side 104 of the insulating substrate 102 is separated from the first metallization 126 to prevent an electrical short between the control terminal bond pad 122 and the first load terminal bond pad 114 of the power semiconductor die 108.

A solderable third contact pad 206 at the second main side 106 of the insulating substrate 102 is formed by the second via 202. Hence only the second load terminal bond pad 118 at the second side 120 of the power semiconductor die 108 need comprise a solderable metal or metal compound such as Cu, whereas the control terminal bond pad 122 and the first load terminal bond pad 114 at the first side 116 of the power semiconductor die 108 may or may not comprise a solderable metal or metal compound. The first vias 124 and the second via 202 each comprise a solderable metal or metal compound such as Cu, and the second via 202 may have the same or similar composition as the first vias 124. The first solder mask 138 is shown covering the entire first main side 104 of the insulating substrate 102 in FIG. 2, but instead may only partly cover the first main side 104 of the insulating substrate 102 or may be omitted altogether, e.g., to enable double-sided cooling.

FIGS. 3A and 3B illustrate an embodiment of a method of producing the semiconductor package 100 shown in FIG. 1. In FIGS. 3A and 3B, the left-hand side of the respective figures shows a plan view of the first main side 104 of the insulating substrate 102 and the right-hand side of the respective figures shows a plan view of the second main side 106 of the insulating substrate 102.

FIG. 3A shows the semiconductor package 100 after embedding the power semiconductor die 108 in the insulating substrate 102 of the package 100, but before forming the first metallization 126 at the first main side 104 of the insulating substrate 102. As shown in FIG. 3A and as explained previously herein, solderable first contact pads 128 at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, and a solderable third contact pad 132 at the second main side 106 of the insulating substrate 102 is formed by the control terminal bond pad 122 of the die 108.

Since the terminal bond pads 118, 122 at the second side 116 of the power semiconductor die 108 are solderable and used as final/direct pads 130, 132 for the semiconductor package 100 at the second main side 106 of the insulating substrate 102, the manufacturing method to produce the package 100 does not require additional processing/metallization layers to provide corresponding points of contact for the package 100. For example, deposition of a seed layer followed by plating of Cu on the terminal bond pads 118, 122 at the second side 116 of the power semiconductor die 108 may be eliminated as part of the package manufacturing process.

FIG. 3B shows the semiconductor package 100 after forming the first metallization 126 at the first main side 104 of the insulating substrate 102. The first metallization 126 is formed by forming the first solder mask 136 on the first main side 104 of the insulating substrate 102. The first solder mask 126 has one or more openings 300 which expose at least part of the first load terminal bond pad 114 at the first side 116 of the power semiconductor die 108 and exposes at least part of the first vias 124 which extend through the insulating substrate 102. Copper is then deposited in the opening(s) 300 of the first solder mask 126. The term 'copper' as used herein refers to Cu and Cu alloys. The first vias 124 and the first load terminal bond pad 114 at the first side 116 of the power semiconductor die 108 are illustrated as dashed boxes in the left-hand part of FIG. 3B, since the first vias 124 and the first load terminal bond pad 114 are covered by the first metallization 126 and therefore obstructed in the left-hand plan view of FIG. 3B.

The right-hand plan view of FIG. 3B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 132 provided at the second main side 106 of the insulating substrate 102 for surface mounting of the semiconductor package 100, as previously explained herein.

FIGS. 4A and 4B illustrate an embodiment of a method of producing the semiconductor package 200 shown in FIG. 2. In FIGS. 4A and 4B, the left-hand side of the respective figures shows a plan view of the first main side 104 of the insulating substrate 102 and the right-hand side of the respective figures shows a plan view of the second main side 106 of the insulating substrate 102.

FIG. 4A shows the semiconductor package 200 after embedding the power semiconductor die 108 in the insulating substrate 102 of the package 200, but before forming the first metallization 126 at the first main side 104 of the insulating substrate 102. As shown in FIG. 4A and as explained previously herein, solderable first contact pads 128 at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, and a solderable third contact pad 206 at the second main side 106 of the insulating substrate 102 is formed by the second via 202.

Since the second load terminal bond pad 118 at the second side 116 of the power semiconductor die 108 is solderable and used as a final/direct pad 130 for the semiconductor package 100 at the second main side 106 of the insulating substrate 102, the manufacturing method to produce the package 100 does not require additional processing/metallization layers to provide corresponding points of contact for the package 100. For example, as explained above, deposition of a seed layer followed by plating of Cu on the second load terminal bond pad 118 at the second side 116 of the power semiconductor die 108 may be eliminated as part of the package manufacturing process.

FIG. 4B shows the semiconductor package 200 after forming the first and second metallizations 126, 204 at the first main side 104 of the insulating substrate 102. The first metallization 126 connects the first load terminal bond pad 114 at the first side 116 of the power semiconductor die 108 to the first vias 124 at the first main side 104 of the insulating substrate 102 and the second metallization 204 connects the control terminal bond pad 122 of the power semiconductor die 108 at the first side 116 of the die 108 to the second via 202 at the first main side 104 of the insulating substrate 102, as previously explained herein.

The first and second metallizations 126, 204 are formed by forming the first solder mask 136 on the first main side 104 of the insulating substrate 102. The first solder mask 126 has a first opening 400 which exposes at least part of the first load terminal bond pad 114 at the first side 116 of the power semiconductor die 108 and exposes at least part of the first vias 124 which extend through the insulating substrate 102. The first solder mask 126 also has a second opening 402 which exposes at least part of the control terminal bond pad 122 at the first side 116 of the power semiconductor die 108 and exposes at least part of the second via 202 which extends through the insulating substrate 102. Copper is then deposited in the first and second openings 400, 402 of the first solder mask 126. The first vias 124 and the first load terminal bond pad 114 and the control terminal bond pad 122 at the first side 116 of the power semiconductor die 108 are illustrated as dashed boxes in the left-hand part of FIG. 3B, since the first vias 124 and the first load terminal bond pad 114 are covered by the first metallization 126 and the control terminal bond pad 122 is covered by the second metallization 204 and therefore obstructed in the left-hand plan view of FIG. 4B.

The right-hand plan view of FIG. 4B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 206 provided at the second main side 106 of the insulating substrate 102 for surface mounting of the semiconductor package 200, as previously explained herein.

Figure 5:
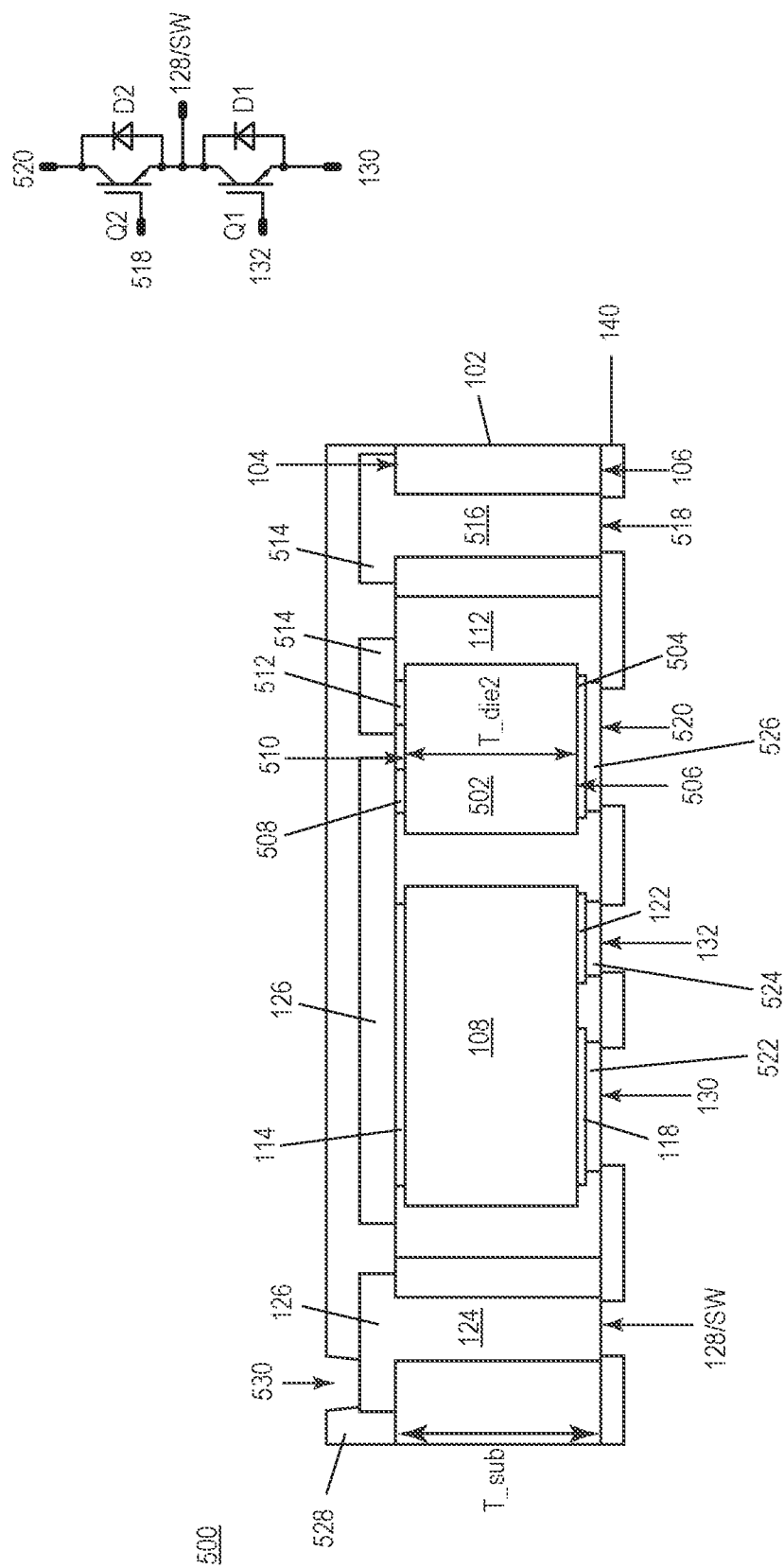
FIG. 5 illustrates a cross-sectional view of another embodiment of a semiconductor package.

FIG. 5 illustrates a cross-sectional view of another embodiment of a semiconductor package 500. The embodiment shown in FIG. 2 is similar to the embodiments shown in FIGS. 1 and 2. Different, however, the semiconductor package 500 in FIG. 5 also includes an additional power semiconductor die 502 embedded in, and thinner than (i.e. T_die2<T_sub) or a same thickness as (i.e. T_die2=T_sub), the insulating substrate 102. The additional power semiconductor die 502 has a first load terminal bond pad 504 at a side 506 of the additional die 502 which faces the same direction as the second main side 106 of the insulating substrate 102. The additional power semiconductor die 502 also has a second load terminal bond pad 508 at a side 510 of the additional die 502 which faces the same direction as the first main side 104 of the insulating substrate 102. The additional power semiconductor die 502 further has a control terminal bond pad 512 at either side 506, 510 of the additional die 502, although the control terminal bond pad 512 is at the second side 506 of the additional die 502 in FIG. 5 as an example.

In one embodiment, the first metallization 126 connects the first load terminal bond pad 114 of the (first) power semiconductor die 108 to the second load terminal bond pad 508 of the additional power semiconductor die 502 in a half bridge configuration at the first main side 104 of the insulating substrate 102. The upper right corner of FIG. 5 includes a circuit schematic of a half bridge circuit, where transistor Q1 corresponds to the first power semiconductor die 108 and transistor Q2 corresponds to the additional power semiconductor die 502. The switch node 'SW' formed by the coupled connection of the power semiconductor dies 108, 502 and formed by the first metallization 126 is brought to the second main side 106 of the insulating substrate by the first vias 124. The entire connection between the first metallization 126 and the first vias 124 is out of view in the cross-sectional view of FIG. 5. For duty cycles less than 50%, the additional power semiconductor die 502, which forms the high-side switch of the half bridge circuit, can be made smaller than the first power semiconductor die 108, which forms the high-side switch of the half bridge circuit, because the low-side switch is on for a longer period of the half bridge switching cycle than the high-side switch. The additional power semiconductor die 502 is shown as being smaller than the first power semiconductor die 108 in the cross-sectional view of FIG. 5 to emphasize this point. The diodes D1, D2 shown in the schematic view of FIG. 5 may be monolithically integrated in the corresponding dies 108, 502 or may be discrete components.

An additional metallization 514 at the first main side 106 of the insulating substrate 102 connects the control terminal bond pad 512 at the second side 510 of the additional power semiconductor die 502 to one or more corresponding additional electrically conductive vias 516 which extend through the insulating substrate 102. The entire connection between the additional metallization 514 and the additional via(s) 124 is out of view in the cross-sectional view of FIG. 5.

A solderable contact pad 518 is formed by the additional vias 516 at the second main side 106 of the insulating substrate 102. Another solderable contact pad 520 at the second main side 106 of the insulating substrate 102 is formed by the first load terminal bond pad 504 at the first side 506 of the additional power semiconductor die 502. This way, all electrical connections for the power semiconductor dies 108, 502 are provided at the second main side 106 of the insulating substrate 102 in the form of respective solderable contact pads 128, 130, 132, 518, 520, giving the semiconductor package 500 an SMD configuration. At least the solderable contact pads 130, 132, 520 formed by the respective terminal bond pads 118, 122, 504 of the power semiconductor dies 108, 502 may have an additional Cu plating 522, 524, 526 as shown in FIG. 5. Alternatively, the additional plating may be omitted as previously described herein.

An insulating layer 528 such as polyimide may be provided at the first main side 104 of the insulating substrate 102 to provide proper insulation at this side of the package 500, and may include one or more openings 530 which expose corresponding one or more of the metallizations 126, 514.

FIGS. 6A and 6B illustrate an embodiment of a method of producing the semiconductor package 500 shown in FIG. 5. In FIGS. 5A and 5B, the left-hand side of the respective figures shows a plan view of the first main side 104 of the insulating substrate 102 and the right-hand side of the respective figures shows a plan view of the second main side 106 of the insulating substrate 102.

FIG. 6A shows the semiconductor package 500 after embedding the power semiconductor dies 108, 502 in the insulating substrate 102 of the package 500, but before forming the metallizations 126, 514 at the first main side 104 of the insulating substrate 102. As shown in FIG. 6A and as explained previously herein, solderable first contact pads 128 for the half bridge switch node SW at the second main side 106 of the insulating substrate 102 are formed by the first vias 124, a solderable second contact pad 130 at the second main side 106 of the insulating substrate 102 is formed by the second load terminal bond pad 118 of the power semiconductor die 108, a solderable third contact pad 520 at the second main side 106 of the insulating substrate 102 is formed by the first load terminal bond pad 504 of the additional power semiconductor die 108, a solderable fourth contact pad 132 at the second main side 106 of the insulating substrate 102 is formed by the control terminal bond pad 122 of the first die 108, and a solderable fifth contact pad 518 at the second main side 106 of the insulating substrate 102 is formed by the corresponding additional via 516.

FIG. 6B shows the semiconductor package 500 after forming the metallizations 126, 514 at the first main side 104 of the insulating substrate 102. The first solder mask 136 is formed on the first main side 104 of the insulating substrate 102. The first solder mask 126 has a first opening 600 that defines the layout/footprint for the first metallization 126. The first opening 600 in the first solder mask 126 exposes at least part of the first load terminal bond pad 114 at the first side 116 of the first power semiconductor die 108, exposes at least part of the second load terminal bond pad 508 at the second side 510 of the additional power semiconductor die 108, and exposes at least part of the first vias 124 which extend through the insulating substrate 102.

The first solder mask 126 also has a second opening 602 that defines the layout/footprint for the second metallization 514. The second opening 602 in the first solder mask 126 exposes at least part of the control terminal bond pad 512 at the second side 510 of the additional power semiconductor die 502 and exposes at least part of the corresponding via 516 which extends through the insulating substrate 102.

Copper is then deposited in the openings 600, 602 of the first solder mask 126. The first vias 124, the first load terminal bond pad 114 at the first side 116 of the power semiconductor die 108, the second load terminal bond pad 508 at the second side 510 of the additional power semiconductor die 108, and the control terminal bond pad 510 at the second side 510 of the additional power semiconductor die 108 and corresponding via 516 are illustrated as dashed boxes in the left-hand part of FIG. 6B, since the vias 124, 516 and the terminal bond pads 114, 508, 512 are covered by the metallizations 126, 514 and therefore obstructed in the left-hand plan view of FIG. 6B.

The right-hand plan view of FIG. 6B shows the second side 106 of the insulating substrate 102 after a second solder mask 140 is provided at the second main side 106 of the insulating substrate 102. The second solder mask 140, if provided, defines the exposed surface area of the respective solderable contact pads 128, 130, 132, 518, 520 provided at the second main side 106 of the insulating substrate 102 for surface mounting of the semiconductor package 500, as previously explained herein.

FIGS. 7A through 7I illustrate respective cross-sectional views of an embodiment of a method of batch producing semiconductor packages of the kind previously described herein.

Figure 7A:
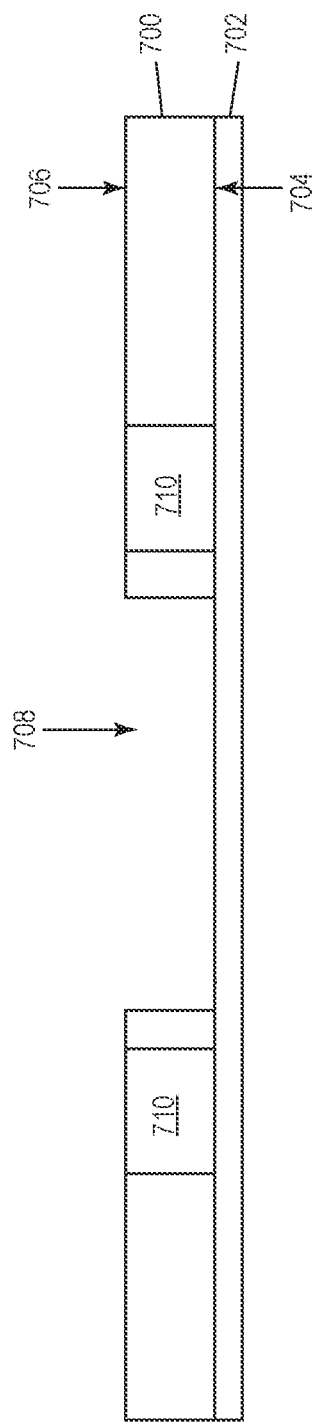

FIG. 7A shows a core insulating panel 700 adhered to a temporary bonding tape 702 at a second main side 704 of the core insulating panel 700 opposite a first main side 706. The core insulating panel 700 has a plurality of openings 708 each sized to receive a power semiconductor die. Only one opening 708 is shown in FIGS. 7A through 7I for ease of illustration. The core insulating panel 700 also has electrically conductive vias 710 which extend through the panel 700. The vias 710 are wide/large enough so that the vias 710 have sufficient surface contact area for use as final/direct pads at the second main side 704 of the panel 700. The core insulating panel 700 may be a laminate with the vias 710 embedded in the laminate as Cu blocks. In another example, the core insulating panel 700 may be a standard PCB laminate with the vias 710 being filled Cu vias. In yet another example, the core insulating panel 700 may be a molded panel with the vias 710 being embedded Cu vias, blocks, leaframe components, etc. The vias 710 in FIG. 7A may correspond to any of the vias 124, 202, 516 shown in FIGS. 1 through 6B.

Figure 7B:
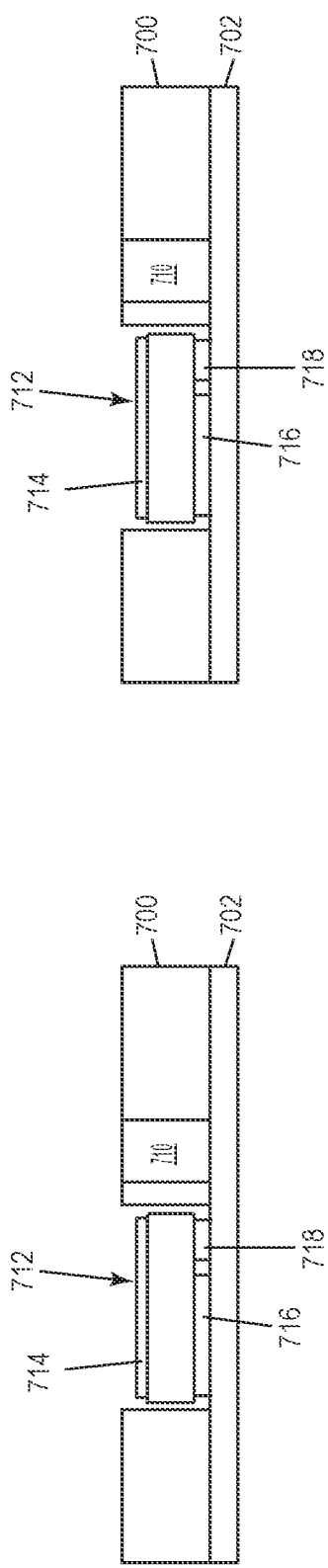

FIG. 7B shows a power semiconductor die 712 inserted in each opening 708 of the core insulating panel 700. Each power semiconductor die 712 is thinner than or a same thickness as the core insulating panel 700 and includes a first load terminal bond pad 714 at a first side which faces the same direction as the first main side 706 of the core insulating panel 700, a second load terminal bond pad 716 at a second side which faces the same direction as the second main side 704 of the core insulating panel 700, and a control terminal bond pad 718 at the first side or the second side of the die 712. The left-hand side of FIG. 7B shows the control terminal bond pad 718 at the side of the die 712 facing the temporary bonding tape 702 (e.g. source-up configuration), and the right-hand side of FIG. 7B shows the control terminal bond pad 718 at the side of the die 712 facing away from the temporary bonding tape 702 (e.g. source-down configuration). In either case, each power semiconductor die 712 is adhered to the temporary bonding tape 702 at the side of the die 712 facing the tape 702.

FIG. 7C shows, after inserting a power semiconductor die 712 in each opening 708 of the core insulating panel 700, filling each opening 708 and covering each power semiconductor die 712 with a resin film 720. Any standard resin film lamination process may be used.

FIG. 7D shows, after filling each opening 708 and covering each power semiconductor die 712 with the resin film 720, removing the temporary bonding tape 702 and planarizing the resin film 720 at the first main side 706 of the core insulating panel 700. Standard planarization techniques may be used such as CMP (chemical-mechanical polishing).

FIG. 7E shows removing the resin film 720' from at least part of the first load terminal bond pad 714 at the side of each power semiconductor die 712 which faces the same direction as the first main side 706 of the core insulating layer 700. In one embodiment, the resin part 720" which remains after exposing the first load terminal bond pad 714 of each power semiconductor die 712 is the insulating material 112 shown in FIGS. 1, 2 and 5.

FIG. 7F forming a seed layer 722 for Cu growth on the first main side 706 of the core insulating panel 700 and on the part of the first load terminal bond pad 714 of each power semiconductor die 712 exposed by removing the resin film 720'. For example, the seed layer 722 may be sputtered on the first main side 706 of the core insulating panel 700 and on the exposed part of the first load terminal bond pad 714 of each power semiconductor die 712.

FIG. 7G shows plating copper 724 on the seed layer 722. Any standard Cu plating process may be used such as ECD.

FIG. 7H shows patterning the plated copper 724 to define at least a first metallization 726. For example, the plated copper 724 may be pattered to define any of the metallizations 126, 204, 514 shown in FIGS. 1 through 6B. Any standard patterning processes such as lithography and etching may be used to pattern the plated copper 724.

Figure 7I:
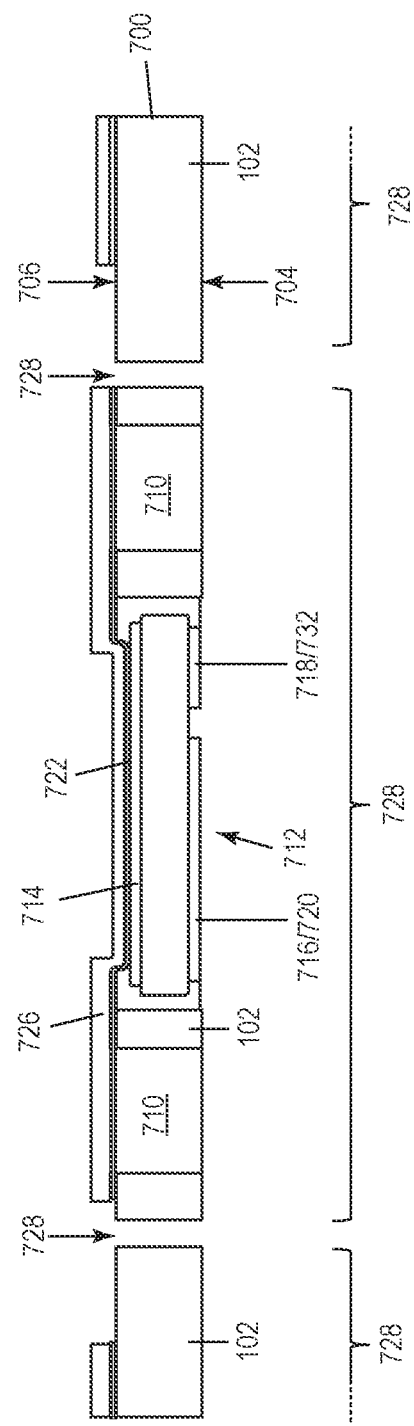

FIG. 7I shows singulating the core insulating panel 700 into separate (individual) packages 728. The core insulating panel 700 may be singulated along dicing/kerf zones 730 to form the separate packages 728 using any standard singulation process such as sawing, laser cutting, etc. One or more solder masks (not shown in FIG. 7I) may also be formed, e.g., as previously described herein.

The individual packages 728 in FIG. 7I may correspond to any of the packages 100, 200, 500 shown in FIGS. 1, 2 and 5. That is, a singulated section of the core insulating panel 700 may correspond to the insulating substrate 102 shown in FIGS. 1 through 6B. Also, the second load terminal bond pad 716 at the side of each die 712 which faces the same direction as the second main side 704 of the singulated core insulating panel 700 forms a solderable contact pad 730 at the second main side 704 of the singulated core insulating panel 700. For the source-up configuration shown in the left-hand side of FIG. 7B, the control terminal bond pad 718 of each die 712 likewise forms a solderable contact pad 732 at the second main side 704 of the singulated core insulating panel 700 as shown in FIG. 7I and similar to what is shown in FIG. 1. For the drain-up configuration shown in the right-hand side of FIG. 7B, the control terminal bond pad 718 is at the other side of the die 712 similar to what is shown in FIG. 2.

FIG. 8 illustrates a cross-sectional view of another embodiment of a method of batch producing semiconductor packages of the kind previously described herein. According to this embodiment, two core insulating panels 700 of the kind previously described herein in connection with FIGS. 7A through 7I are vertically stacked on one another to improve processability and throughput. The core insulating panels 700 may be stacked using a double-sided release tape, temporary glue/wax, or other type of temporary carrier structure 800 such as a carrier 802 interposed between two temporary bonding tapes 804. The core insulating panels 700 instead may be clamped together under a vacuum, with a jig, screw, etc. before die placement, or by lamination, sputtering, plating, etc. Power semiconductor dies 712 are inserted in the openings 708 in both core insulating panels 700 as shown in FIG. 8, and then processing of both panels 700 continues as shown in FIGS. 7C through 7I.

Figure 9:
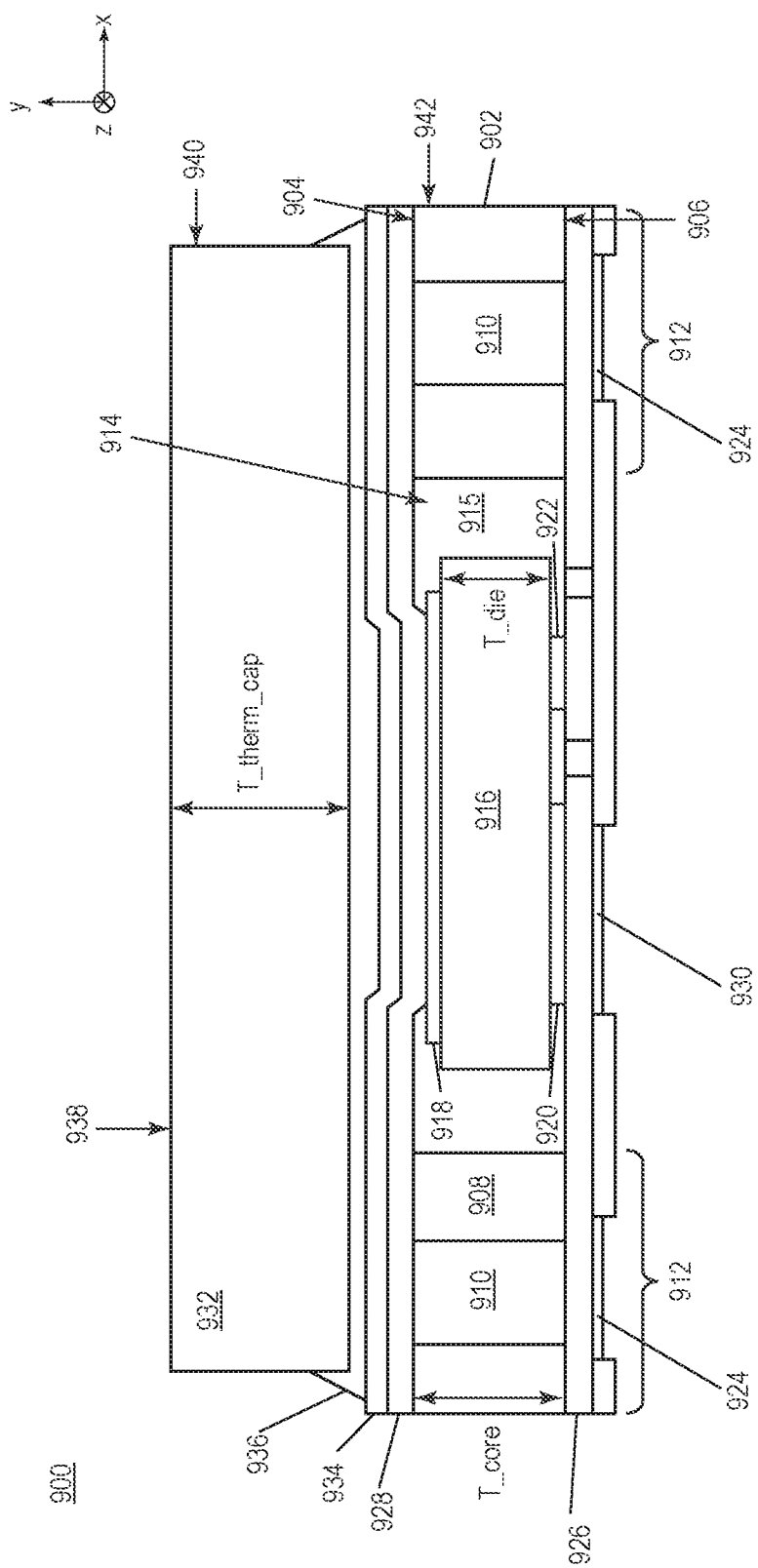
FIG. 9 illustrates a cross-sectional view of another embodiment of a semiconductor package.

FIG. 9 illustrates a cross-sectional view of another embodiment of a semiconductor package 900. According to this embodiment, the semiconductor package 900 includes a substrate 902 having a first main surface 904, a second main surface 906 opposite the first main surface 904, an electrically insulating core 908 between the first and second main surfaces 904, 906, and at least one electrically conductive first via 910 extending through a periphery region 912 of the core 908, the periphery region 912 defining an opening 914 in the core 908 that is at least partly filled with an insulating material 915 such as an epoxy, resin, etc. For example, the insulating material 915 may be a resin that comprises glass fibres interwoven with epoxy material.

At least one power semiconductor die 916 is embedded in the opening 914 in the electrically insulating core 908 of the substrate 902. The power semiconductor die 916 is thinner than or a same thickness as the core 908 (T_die≤T_core).

The power semiconductor die 916 includes a first load terminal (e.g. drain) bond pad 918 at a first side which faces a same direction as the first main surface 904 of the substrate 902. The power semiconductor die 916 also includes a second load terminal (e.g. source) bond pad 920 at a second side which faces a same direction as the second main surface 906 of the substrate 902. The power semiconductor die 916 further includes a control terminal bond pad 922 at the first or second side of the die 916.

The semiconductor package 900 illustrated in FIG. 9 also includes at least one plated first contact pad 924 at the second main surface 906 of the substrate 902 and provided by the first via 910. In one embodiment, the plated first contact pad 924 is also provided in part by a metallization 926 at the second main surface 906 of the substrate 902. For example, the substrate 902 may be a DBC (direct bonded copper) substrate, an AMB (active metal brazed) substrate, an IMS (insulated metal substrate), a PCB, a PCB laminate, etc. and having a sheet of copper 926, 928 bonded to one or both sides 104, 106 of the electrically insulating core 908. One or both copper sheets 926, 928 may be patterned or un-patterned. For example, the metallization 926 at the second main surface 906 of the substrate 902 may be patterned to form a plated second contact pad 930 at the second main surface 906 of the substrate 902 and provided by the second load terminal bond pad 920 of the power semiconductor die 916. The plated contact pads 924, 930 may be separated from one another by a solder mask 931 applied at the second main surface 906 of the substrate 902.

The semiconductor package 900 illustrated in FIG. 9 further includes a thermal capacitor 932 attached to the first main surface 904 of the substrate 902. The thermal capacitor 932 should not be confused with a standard heat sink. A standard heat sink is a passive heat exchanger that transfers heat generated by an electronic or a mechanical device to a fluid medium, such as air or a liquid coolant, where it is dissipated away from the device, thereby allowing regulation of the device temperature. Instead, the term 'thermal capacitor' as used herein means that the thermal capacitor 932 is designed to absorb transient heat pulses from the power semiconductor die 916 and subsequently release the transient heat pulses to the surrounding environment. A standard heat sink would have to be oversized to handle such transient heat pulses, thus increasing the package size and cost.

Under certain application conditions, the power semiconductor die 916 may have to be robust against peak current events for a short time period. A typical application example is a battery-powered drill where the power semiconductor die 916 forms part of an inverter placed around a rotor of the drill motor. A fan provides air cooling for the inverter when the motor turns. At the moment the rotor begins to lock as a result of too high torque, a worst-case thermal load condition occurs since the motor current is at a maximum peak and at the same time no cooling is provided since the fan on the rotor does not rotate anymore. The energy, however, still needs to be stored to avoid overheating and potential damage or destruction of the power semiconductor die 916. The thermal capacitor 932 is designed to absorb the transient heat pulses from the power semiconductor die 916 during the worst-case thermal load condition. After the drill returns to normal operation, the thermal capacitor 932 is further designed to release the transient heat pulses to the surrounding environment. In a specific example, the power semiconductor die 916 may be a 60V device with a package size of 6.3 mm×4.74 mm and an Ron (on-state resistance)=1 milliohm at operation temperature. The maximum peak current Imax_peak may be 300 A for t=250 ms.

Figure 10:
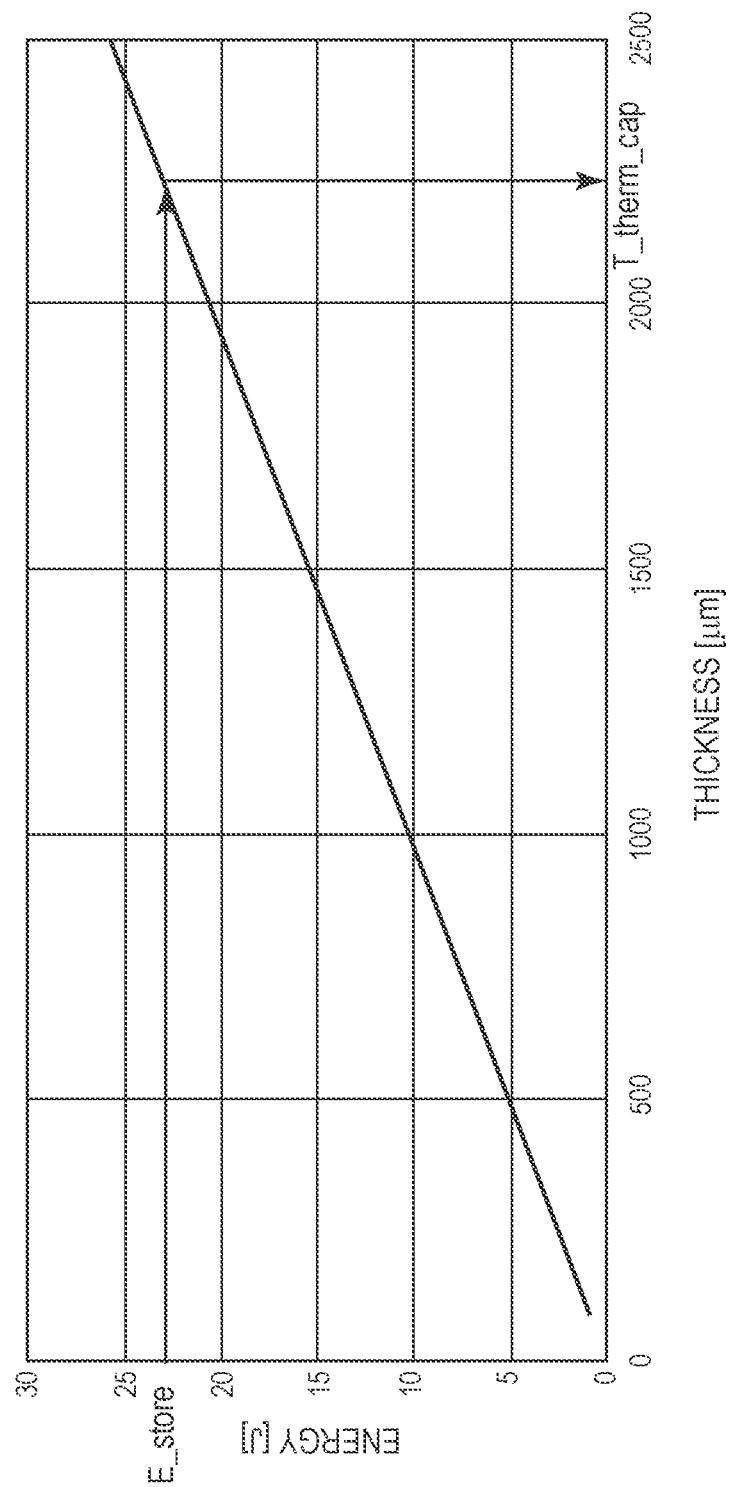
FIG. 10 illustrates a plot which shows the relationship between energy capacity and thickness for the thermal capacitor of the package shown in FIG. 9, for a specific example.

In this example, the thermal capacitor 932 is designed to store 6.25e-6 kWh or 22.5 J of energy in the form of transient heat pulses from the power semiconductor die 916 and subsequently release the energy to the surrounding environment. As shown in FIG. 10, the thermal capacitor 932 in this example is designed to store 6.25e-6 kWh or 22.5 J of energy ('E_store') at a thickness ('T_therm_cap') of about 2200 μm.

More generally, the thickness 'T_therm_cap' of the thermal capacitor 932 is based on the magnitude of the transient heat pulses generated by the power semiconductor die 916 during a worst-case thermal load condition. In one embodiment, the magnitude of the transient heat pulses is in a range of 5 to 25 Joules and the thickness T_therm_cap of the thermal capacitor 932 is in a range of 500 to 2500 μm. In another embodiment, the thickness T_therm_cap of the thermal capacitor 932 is in a range of 100 to 500 μm.

As shown in FIG. 9, the thermal capacitor 932 may be attached to the metallization 928 at the first main surface 904 of the substrate 902 or to a plated (e.g. Au) surface 934 of the metallization 928 using a thermally conductive material 936. The metallization 928 at the first main surface 904 of the substrate 902 connects the first load terminal bond pad 918 of the power semiconductor die 916 to the first via 910, according to this embodiment. The thermally conductive material 936 may be electrically insulative or conductive. For example, the thermally conductive material 936 may be solder, an adhesive glue or tape, etc. In the case of an electrically conductive material 936 for attaching the thermal capacitor 932, the thermal capacitor 932 may also improve the electrical performance of the package 900 by distributing current and therefore reducing package resistance.

The surface 938 of the thermal capacitor 932 that faces away from the substrate 902 may be structured to increase surface contact with the surrounding environment. For example, the surface 938 of the thermal capacitor 932 that faces away from the substrate 902 may have fins, bumps, etc. that improve the transfer of heat energy to the surrounding environment.

The thermal capacitor 932 may have lateral dimensions (in the x and/or z directions in FIG. 9) that are less than the lateral dimensions of the electrically insulating core 908 of the substrate 902. Accordingly, the (lateral) border 940 of the thermal capacitor 932 is spaced inward from the (lateral) border 942 of the core 908. In one embodiment, the (lateral) border 940 of the thermal capacitor 932 is spaced inward from the (lateral) border 942 of the core 908 in a range of 100 to 250 μm.

Figure 11:
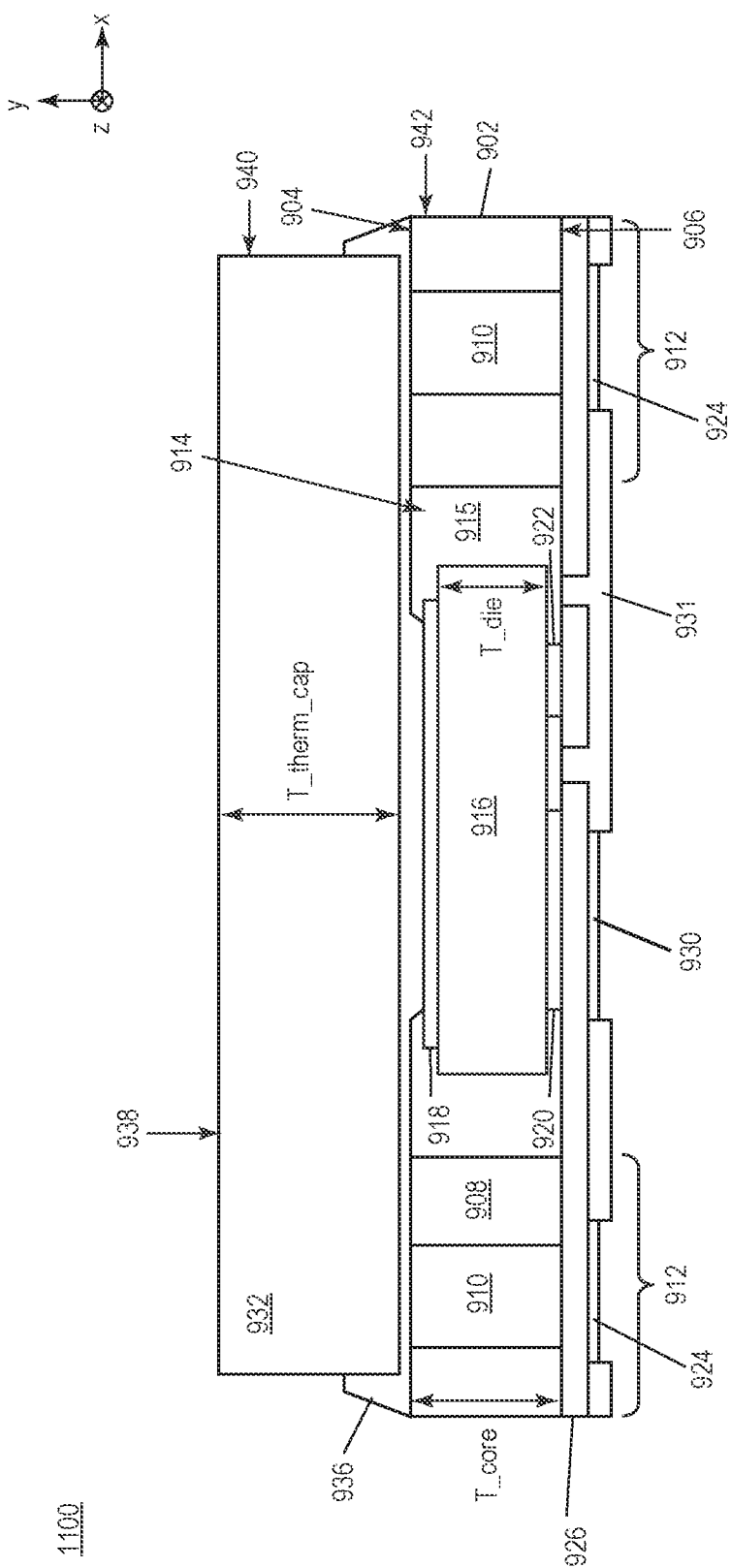
FIG. 11 illustrates a cross-sectional view of another embodiment of a semiconductor package.

FIG. 11 illustrates a cross-sectional view of another embodiment of a semiconductor package 1100. The embodiment shown in FIG. 11 is similar to the embodiment shown in FIG. 9. Different, however, the metallization 928 and corresponding plated surface 934 are omitted at the first main surface 904 of the substrate 902. Instead, the thermal capacitor 932 is attached to the first via 910 and to the first load terminal bond pad 918 of the power semiconductor die 916 by the thermally conductive material 936. According to this embodiment, the thermally conductive material 936 that attaches the thermal capacitor 932 to the first via 910 and to the first load terminal bond pad 918 of the power semiconductor die 916 is also electrically conductive. For example, the material 936 may be solder. Accordingly, the thermal capacitor 932 electrically connects the first load terminal bond pad 918 to the first via 910. In this way, the thermal capacitor 932 helps to bring the electrical connection from the backside of the power semiconductor die 916 to the second main surface 906 of the substrate 902.

Figure 12:
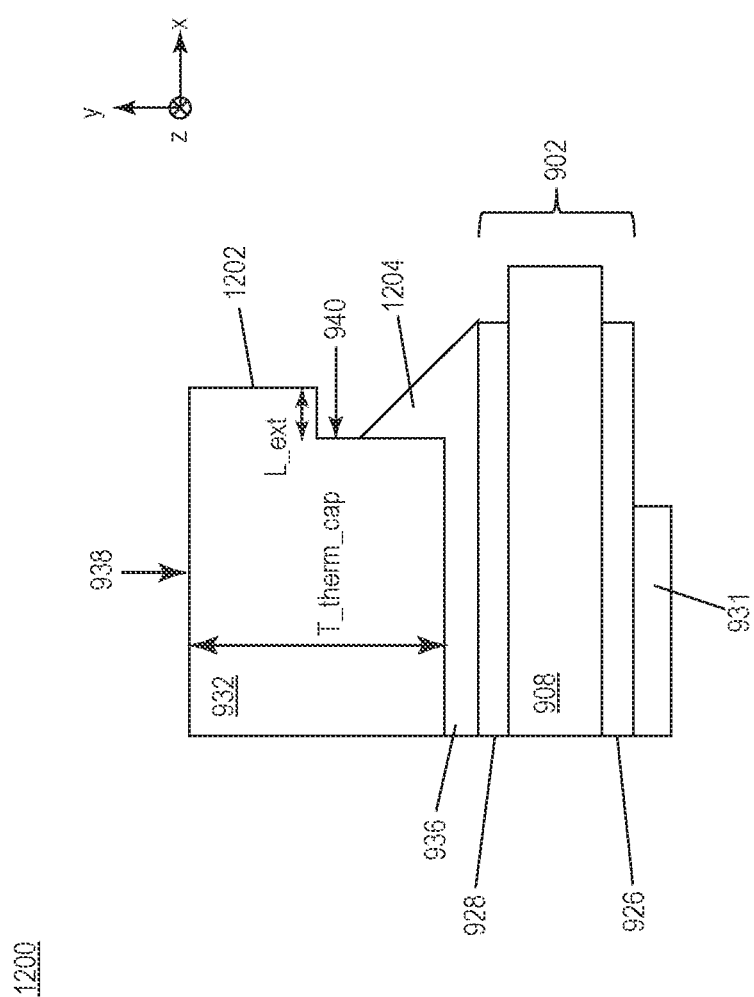
FIG. 12 illustrates a partial cross-sectional view of another embodiment of a semiconductor package.

FIG. 12 illustrates a cross-sectional view of an embodiment of an edge region of a semiconductor package 1200. According to this embodiment, the thermally conductive material 936 that attaches the thermal capacitor 932 to the substrate 902 is solder and the (lateral) border 940 of the thermal capacitor 932 has a protrusion 1202 that prevents a solder fillet 1204 from reaching the surface 938 of the thermal capacitor 932 that faces away from the substrate 902. The protrusion 1202 may be formed by stamping, etching, etc. In one embodiment, the length or extension 'L_ext' of the protrusion 1202 is in a range of 25% to 75% of the thickness T_therm_cap of the thermal capacitor 932.

Figure 13:
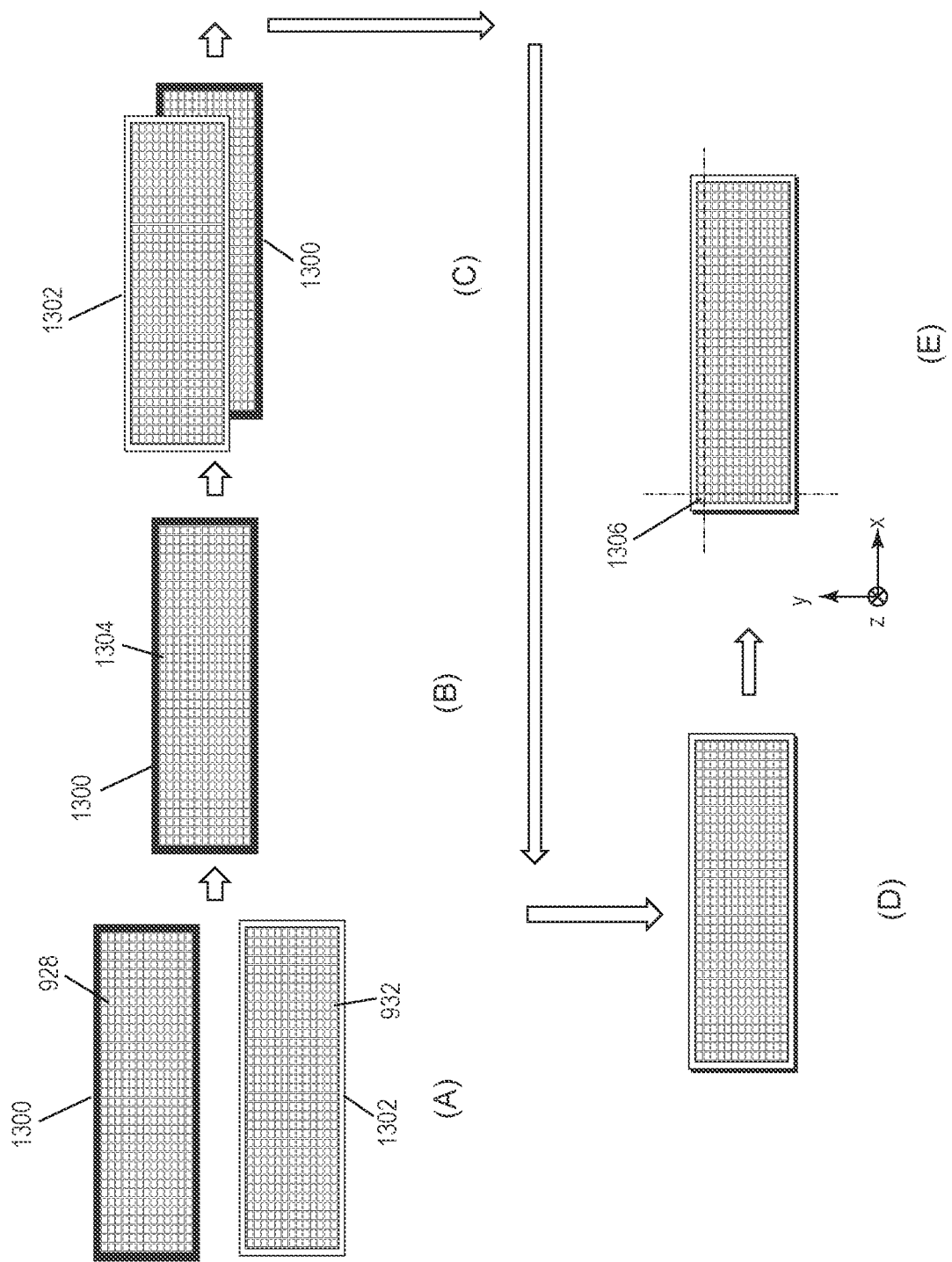
FIG. 13 illustrates an embodiment of a method of batch producing any of the semiconductor packages shown in FIGS. 9, 11 and 12.
Figure 14:
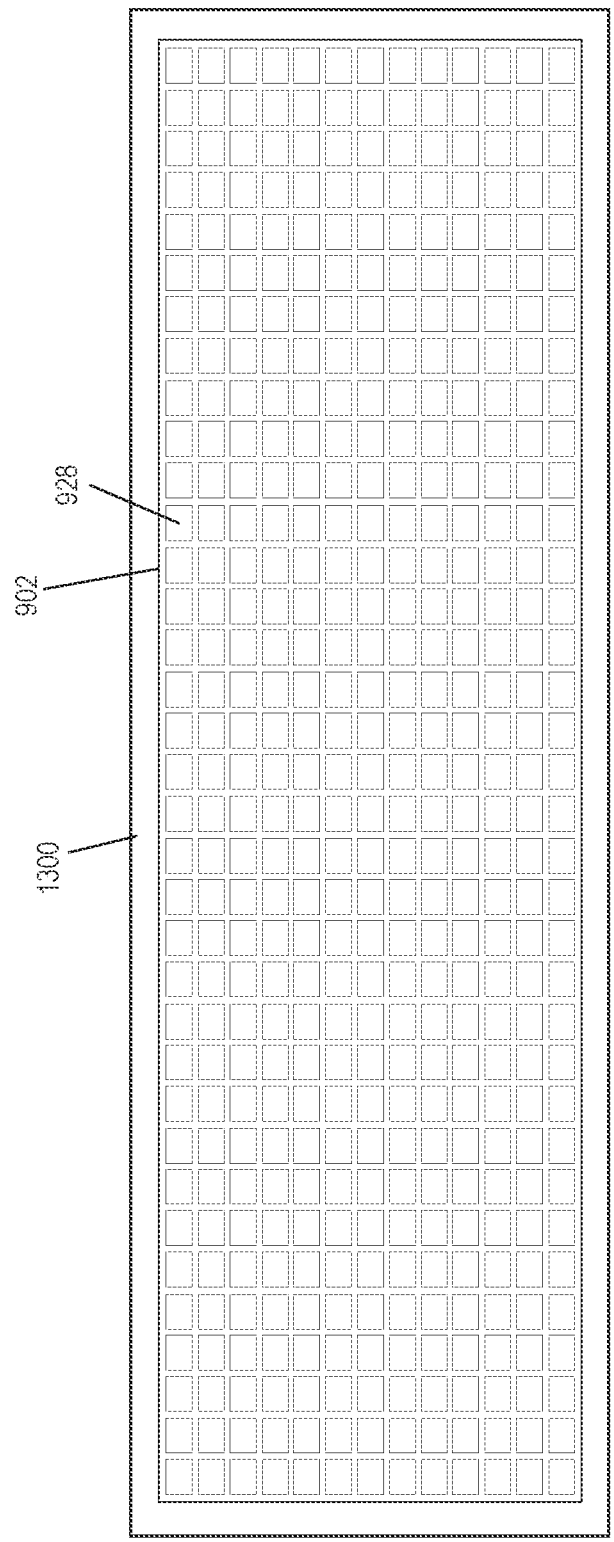
FIG. 14 illustrates an enlarged top plan view of a first panel.
Figure 15:
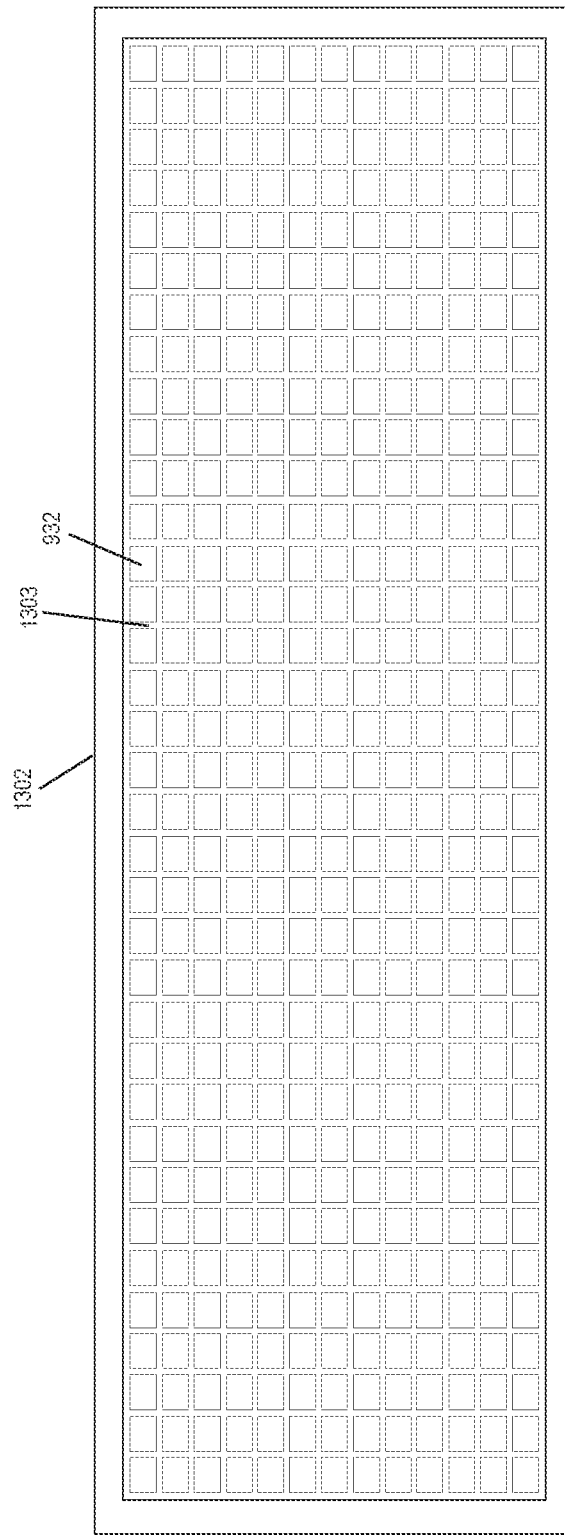
FIG. 15 illustrates an enlarged top plan view of a second panel used in the method of FIG. 13.

FIG. 13 illustrates an embodiment of a method of batch producing any of the semiconductor packages 900, 1100, 1200 shown in FIGS. 9, 11 and 12. The method includes providing (a) a first panel 1300 and a second panel 1302. The first panel 1300 includes a plurality of interconnected substrates 902 with openings and a power semiconductor die embedded in each opening, e.g., as shown in FIGS. 9, 11 and 12. Only the top metallization 928 of each interconnected substrate 902 is visible in FIG. 13. The second panel 1302 includes a plurality of interconnected thermal capacitors 932. The interconnected thermal capacitors 932 may be formed from a high thermal conductive metallic material such as Cu, AlSiCu, etc. The surface of the interconnected thermal capacitors 932 may be plated with another thin metal layer such as Ni, NiAu, Ag, etc. FIG. 14 illustrates an enlarged top plan view of the first panel 1300, and FIG. 15 illustrates an enlarged top plan view of the second panel 1302. As shown in FIG. 15, the thermal capacitors 932 may be interconnected to one another by narrow metal bridges 1303. Instead of being interconnected, the thermal capacitors 932 may be mounted individually, e.g., as separate Cu blocks mounted to respective substrates 902 of the first panel 1300 using a standard surface mount process.

The method further includes applying (b) an attach material 1304 such as a solder paste to the substrates 902 of the first panel 1300 and/or the thermal capacitors 932 of the second panel 1302, e.g., by screen printing.

The method further includes aligning (c) the first panel 130 with the second panel 1302 such that the interconnected thermal capacitors 932 are aligned with respective ones of the substrates 902.

The method further includes attaching (d) each thermal capacitor 932 to the corresponding substrate 902 aligned with the thermal capacitor 932 by the attach material 1304 previously applied to the substrates 902 of the first panel 1300 and/or the thermal capacitors 932 of the second panel 1302. Depending on the type of attach material 1304 used, the attach material 1304 may be cured, reflowed, etc. to attach the thermal capacitors 932 to the corresponding substrates 902.

Figure 16:
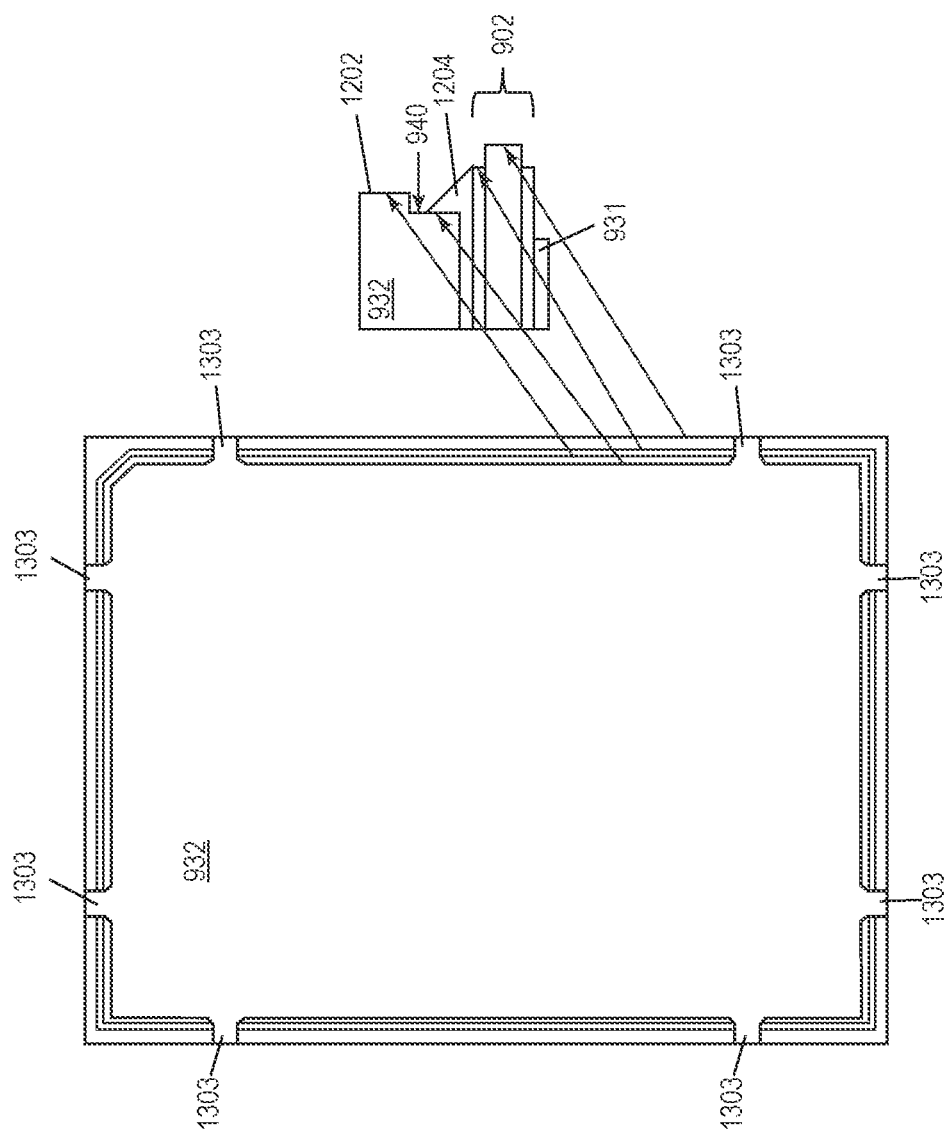
FIG. 16 illustrates a top plan view of one interconnected thermal capacitor after being attached to a corresponding substrate, according to the method of FIG. 13.

FIG. 16 illustrates a top plan view of one of the interconnected thermal capacitors 932 after being attached to the corresponding substrate 902. FIG. 16 maps the different edges of the stacked structure to the example embodiment shown in FIG. 12, as an example.

The method further includes, after the attaching, cutting (e) through regions of the first panel 1300 which interconnect the substrates 902 and through regions of the second panel 1302 which interconnect the thermal capacitors 932 to form individual packages 1306. Each individual package 1306 includes a substrate 902, a power semiconductor die (out of view) embedded in the substrate and a thermal capacitor 932 attached to the substrate 902, the thermal capacitor 932 being designed to absorb transient heat pulses from the power semiconductor die included in the same package 902 as the thermal capacitor 932 and subsequently release the transient heat pulses to a surrounding environment, e.g., as previously described herein connection with FIGS. 9 through 12.

The panels 1300, 1302 are cut in the x and y directions in FIG. 13. Two of the cuts are shown as dashed lines in FIG. 9, and may be done by sawing, laser etching, stamping, etc. The cutting may be performed successively (one line at a time in the x and y directions) or simultaneously, e.g., in the case of stamping. As previously explained herein, the (lateral) border of each thermal capacitor 932 may be spaced inward from the (lateral) border of each substrate core 908 to prevent damage/contamination of the thermal capacitors 932 during the cutting/package singulation process.

Figure 17:
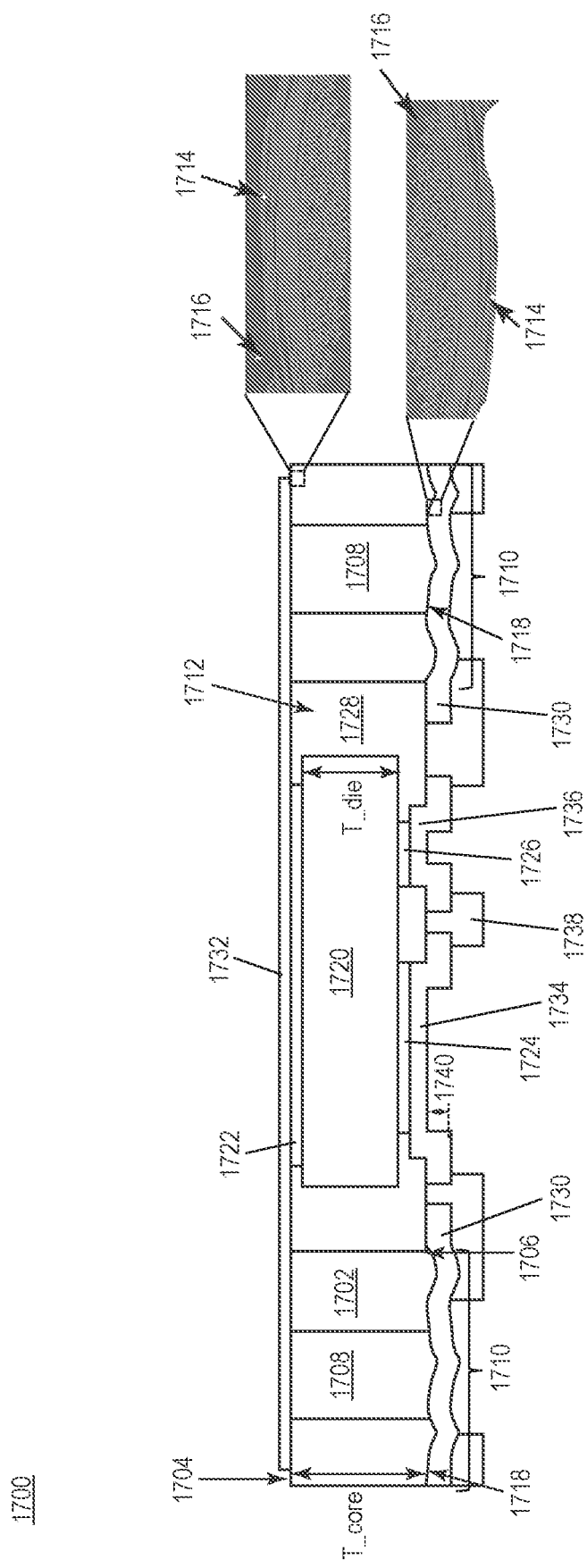
FIG. 17 illustrates a cross-sectional view of another embodiment of a semiconductor package.

FIG. 17 illustrates a cross-sectional view of another embodiment of a semiconductor package 1700. According to this embodiment, the semiconductor package 1700 includes an electrically insulating core 1702 having a first side 1704, a second side 1706 opposite the first side 1704 and configured for mounting to another substrate (not shown), and at least one electrically conductive first via 1708 extending through a periphery region 1710 of the core 1702. The periphery region 1710 defines an opening 1712 in the core 1702. The core 1702 comprises glass fibres 1714 interwoven with epoxy material 1716 as shown in the upper enlarged view of FIG. 17. The core 1702 has one or more regions 1718 at the second (mounting) side 1706 where the glass fibres 1714 are exposed from the epoxy material 1716.

At least one power semiconductor die 1720 embedded in the opening 1712 in the core 1702. The power semiconductor die 172 is thinner ('T_die'≤'T_core') than the core 1702 and has a first load terminal (e.g. drain) bond pad 1722 at a first side which faces a same direction as the first side 1704 of the core 1702, a second load terminal (e.g. source) bond pad 1724 at a second side which faces a same direction as the second (mounting) side 1706 of the core 1702, and a control terminal bond pad 1726 at the first side or the second side of the power semiconductor die 1720.

A resin 1728 fills the opening 1712 in the core 1702 and encases the power semiconductor die 1720. At least one plated first contact pad 1730 at the second (mounting) side 1706 of the core 1702 is provided by the first via 1708. A plated second contact pad 1732 at the first side 1704 of the core 1702 is provided by the first load terminal bond pad 1722 of the power semiconductor die 1720. A plated third contact pad 1734 at the second side 1706 of the core 1702 is provided by the second load terminal bond pad 1724 of the power semiconductor die 1720. A plated fourth contact pad 1736 is provided by the control terminal bond pad 1726 of the power semiconductor die 1720.

An optional solder mask 1738 covers the one or more regions 1710 at the second side 1706 of the core 1702 where the glass fibres 1714 are exposed from the epoxy material 1716. Accordingly, when the package 1700 is subsequently mounted to a substrate such as a circuit board with the second side 1706 of the core 1702 facing the substrate, the exposed glass fibres 1714 will not be readily visible. With optimal die design, the solder mask 1738 may be omitted.

Glass fibres 1714 become exposed from the epoxy material 1716 during removal of the resin material 1728 from the second side 1706 of the core 1702, the removal being done by a dry plasma process. Hence, the resin 1728 is formed coplanar with the first side 1704 of the core 1702 so that the resin 1728 need not be removed by dry plasma etching at the first side 1704 of the core 1702 which is the visible side post mounting of the package 700.

According to the embodiment shown in FIG. 17, a recess 1740 is present at the second (mounting) side 1706 of the package 1700. The recess 1740 is deeper than other pad areas. Since a larger solder ball can be trapped in the recess 1740 which can lead to degraded thermal and/or electrical performance of the device, a solder ball (not shown) may be added under carefully controlled conditions prior to package shipment. This way, any issues associated with a larger solder ball may be addressed before shipment of the semiconductor package 1700 shown in FIG. 17.

Described next is an embodiment of a method of producing the semiconductor package 1700 shown in FIG. 17.

Figure 18:
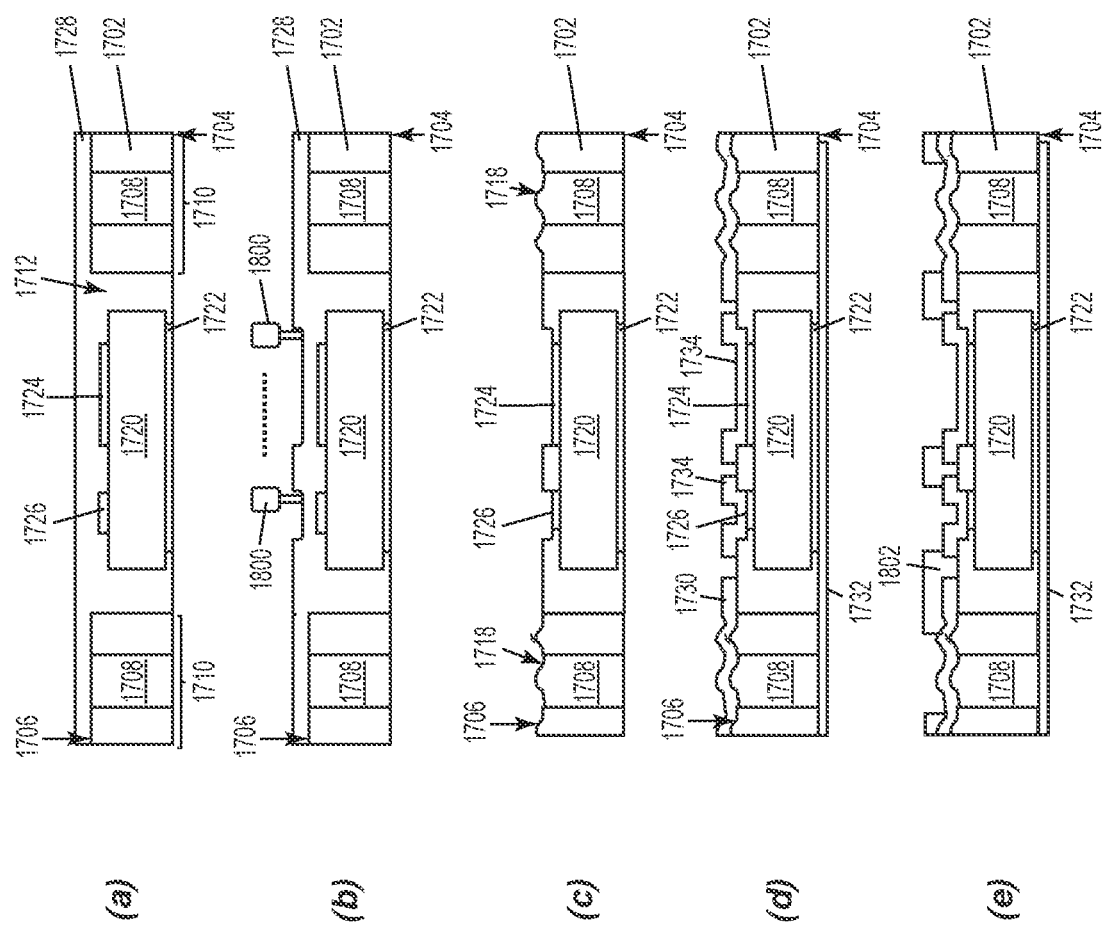
FIG. 18 illustrates an embodiment of a method of producing the semiconductor package shown in FIG. 17.

FIG. 18 illustrates an embodiment of a method of producing the semiconductor package 1700 shown in FIG. 17. The method includes positioning (a) the electrically insulating core 1702 with the first side 1704 of the core 1702 facing downward and the second side 1706 of the core 1702 facing upward. As previously explained herein, the second side 1706 of the core 1702 is configured for mounting to another substrate and at least one electrically conductive first via 1708 extends through the periphery region 1710 of the core 1702. The periphery region 1710 defines an opening 1712 in the core 1702 and the core 1702 includes glass fibres interwoven with epoxy material. In one embodiment, the core 1702 is an FR4 prepreg (pre-impregnated) material.

The method further includes placing (a) at least one power semiconductor die 1720 in the opening 1712 in the core 1702. The power semiconductor die 1720 is thinner than the core 102 and has a first load terminal bond pad 1722 facing downward in the same direction as the first side 1704 of the core 1702, a second load terminal bond pad 1724 facing upward in the same direction as the second side 1706 of the core 1702, and a control terminal bond pad 1726 at the first side or the second side of the power semiconductor die 1720.

The method further includes, at the second side 1706 of the core 1702, filling (a) the opening 1712 in the core 1702 with a resin material 1728 that encases the power semiconductor die 1720.

The method further includes, at the second side 1706 of the core 1702, reducing (b) the thickness of the resin 1728 in a region overlying the second load terminal bond pad 1724 of the power semiconductor die 1720. If the control terminal bond pad 1726 is provided at the same side of the die 1720 as the second load terminal bond pad 1724, the thickness of the resin 1728 is also reduced in a region overlying the control terminal bond pad 1726 of the power semiconductor die 1720. In one embodiment, the thickness of the resin 1728 is (locally) reduced in a region overlying the second load terminal bond pad 1724 of the power semiconductor die 1720 by laser etching/drilling 1800 of the region of the resin 1728 overlying the second load terminal bond pad 1724 of the die 1720 at the second side 1706 of the core 1702. If the control terminal bond pad 1726 is provided at the same side of the die 1720 as the second load terminal bond pad 1724, the region of the resin 1728 overlying the control terminal bond pad 1726 of the power semiconductor die 1720 is also laser etched at the second side 1706 of the core 1702.

The method further includes, after reducing the thickness of the resin 1728 in target regions, thinning (c) the resin 1728 to expose the first via 1708 and the second load terminal bond pad 1724 of the power semiconductor die 1720. If the control terminal bond pad 1726 is provided at the same side of the die 1720 as the second load terminal bond pad 1724, the thinning (c) of the resin 1728 also exposes the control terminal bond pad 1726. In one embodiment, the resin 1728 is thinned at the second side 1706 of the core 1702 to expose the first via 1708, the second load terminal bond pad 1724 of the power semiconductor die 1720 and optionally the control terminal bond pad 1726 of the die 1720 by plasma etching of the resin 1728 at the second side 1706 of the core 1702. The plasma etching process exposes the glass fibres 1714 from the epoxy material 1716 of the core 1702 in one or more regions 1718 at the second side 1706 of the core 1702. However, since the second side 1706 of the core 1702 is the mounting side, the exposed fibres will not be visible post package mounting.

The method may further include plating (d) the first via 1708 at the second side 1706 of the core 1702 to form a plated first contact pad 1730 at the second side 1706 of the core 1702. In one embodiment, the first via 1708 at the second side 1706 of the core 1702 is plated with Cu. Surface unevenness present at the one or more regions 1718 at the second (mounting) side 1706 of the core 1702 where the glass fibres 1714 are exposed from the epoxy material 1716 may transfer to the plated first contact pad 1730 at the second side 1706 of the core 1702. The second load terminal bond pad 1724 of the power semiconductor die 1720 is also plated (d) to form a plated second contact pad 1734 at the second side 1706 of the core 1702. If the control terminal bond pad 1726 is provided at the same side of the die 1720 as the second load terminal bond pad 1724, the control terminal bond pad 1726 may also be plated (d) to form a plated third contact pad 1736 at the second side 1706 of the core 1702.

The method may further include plating (d) an unmasked region at the first side 1704 of the core 1702 to form a metallization 1732 that electrically connects the first load terminal bond pad 1722 of the power semiconductor die 1720 to the first via 1708 at the first side 1704 of the core 1702. In one embodiment, the metallization 1732 is formed by plating Cu onto the unmasked region at the first side 1704 of the core 1702.

The method further includes partly covering (e), with a solder mask 1802, the one or more regions 1710 at the second side 1706 of the core 1702 where the glass fibres 1714 are exposed from the epoxy material 1716. Accordingly, the part of the plated first contact pad 1730 with surface unevenness and which is not contact by an interconnect such as a solder ball, Cu pillar, etc. is covered by the solder mask 1802.

FIGS. 19A through 19D illustrate an embodiment of an alternative approach wherein the non-mounting side of the package 900 shown in FIG. 9 is processed, but without the laser thinning step (b) shown in FIG. 18. Each of FIGS. 19A through 19D includes a cross-sectional view (a) and a corresponding top down plan view (b) of the package during different stages of production.

Figure 19A:
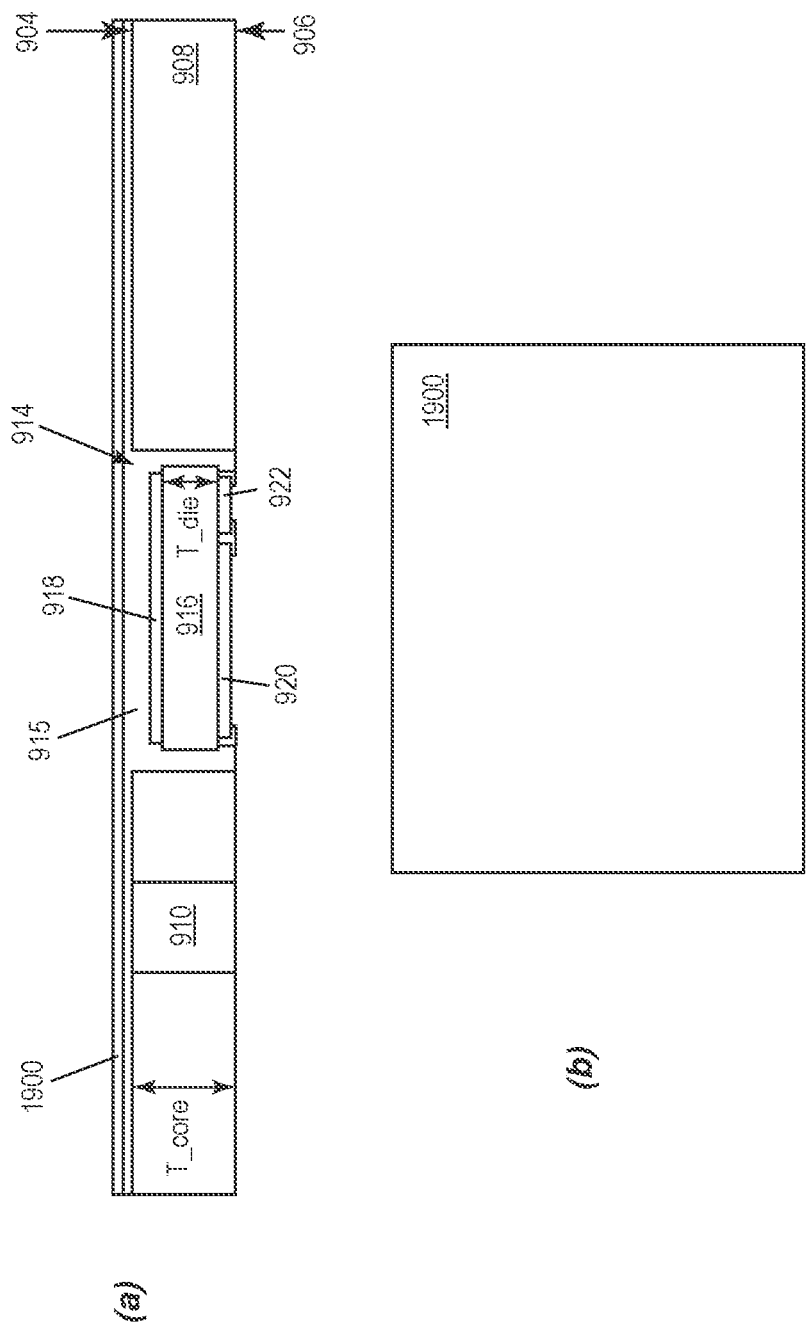
FIGS. 19A through 19D illustrate an embodiment of a method of producing the semiconductor package shown in FIG. 9.

In FIG. 19A, the core 908 is processed with the second (mounting) side 906 facing down such that the resin 915 covers the first side 904 of the core 908. The resin 915, which comprises glass fibres interwoven with epoxy material in this case, has already been thinned in FIG. 19A by a plasma process. The resin 915 may be completely removed from the first side 904 of the core 908, if preferred, so that only a thinned region of resin 915 remains over the first load terminal bond pad 918 of the power semiconductor die 916. A mask 1900 is formed on the thinned resin 915, e.g., by sputtering a layer of material on the thinned resin 915.

As previously described herein in connection with FIG. 9, at least one power semiconductor die 916 is placed in an opening 914 in the core 915. The power semiconductor die 916 is thinner ('T_die'≤'T_core') than the core 915 and includes a first load terminal (e.g. drain) bond pad 918 facing upward in the same direction as the first side 904 of the core 908, and a second load terminal (e.g. source) bond pad 920 facing downward in the same direction as the second side 906 of the core 908. The opening 914 in the core 908 is filled with the resin 915 that encases the power semiconductor die 916.

Figure 19B:
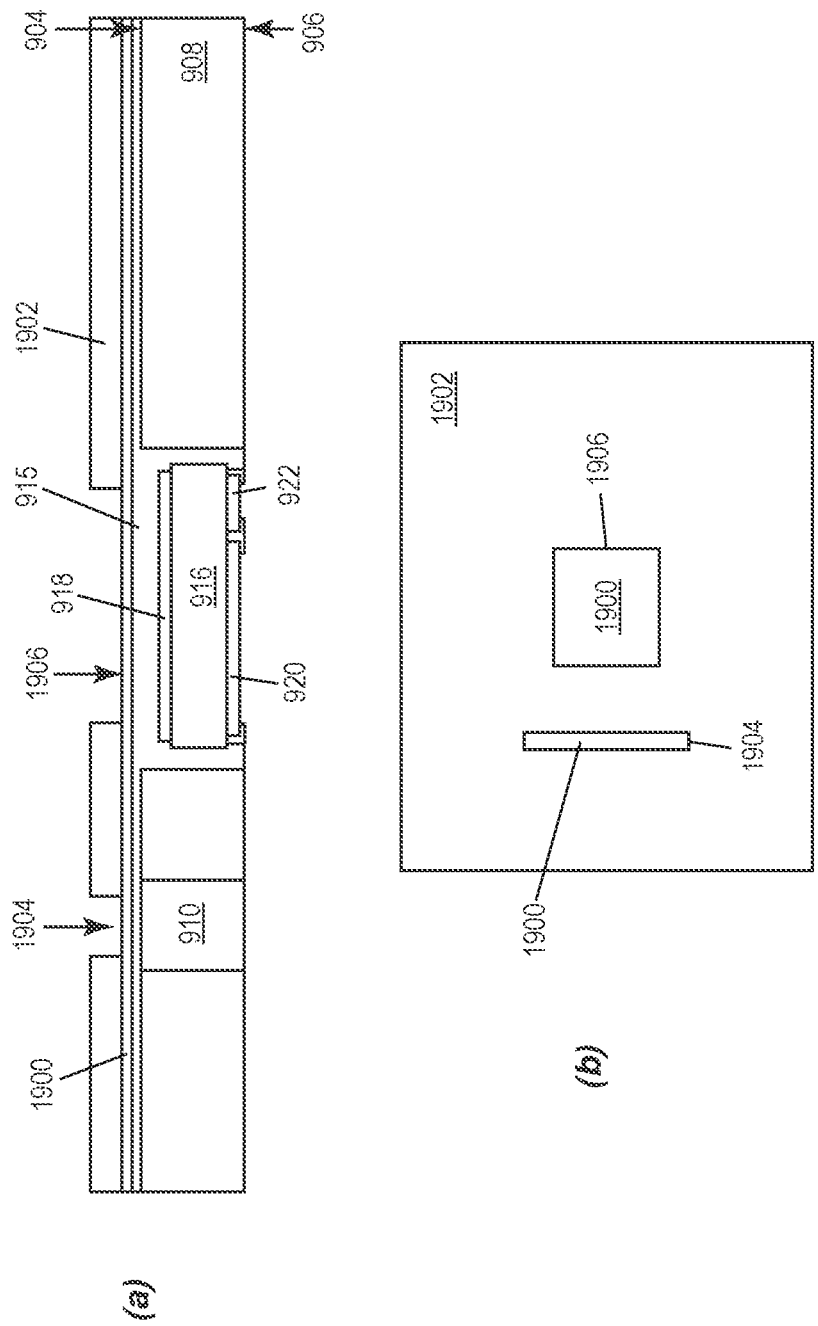

In FIG. 19B, a photoresist 1902 is formed on the sputtered layer 1900. The photoresist 1902 has a first opening 1904 aligned with the first via 910 and a second opening 1906 aligned with the first load terminal bond pad 918 of the power semiconductor die 916.

Figure 19C:
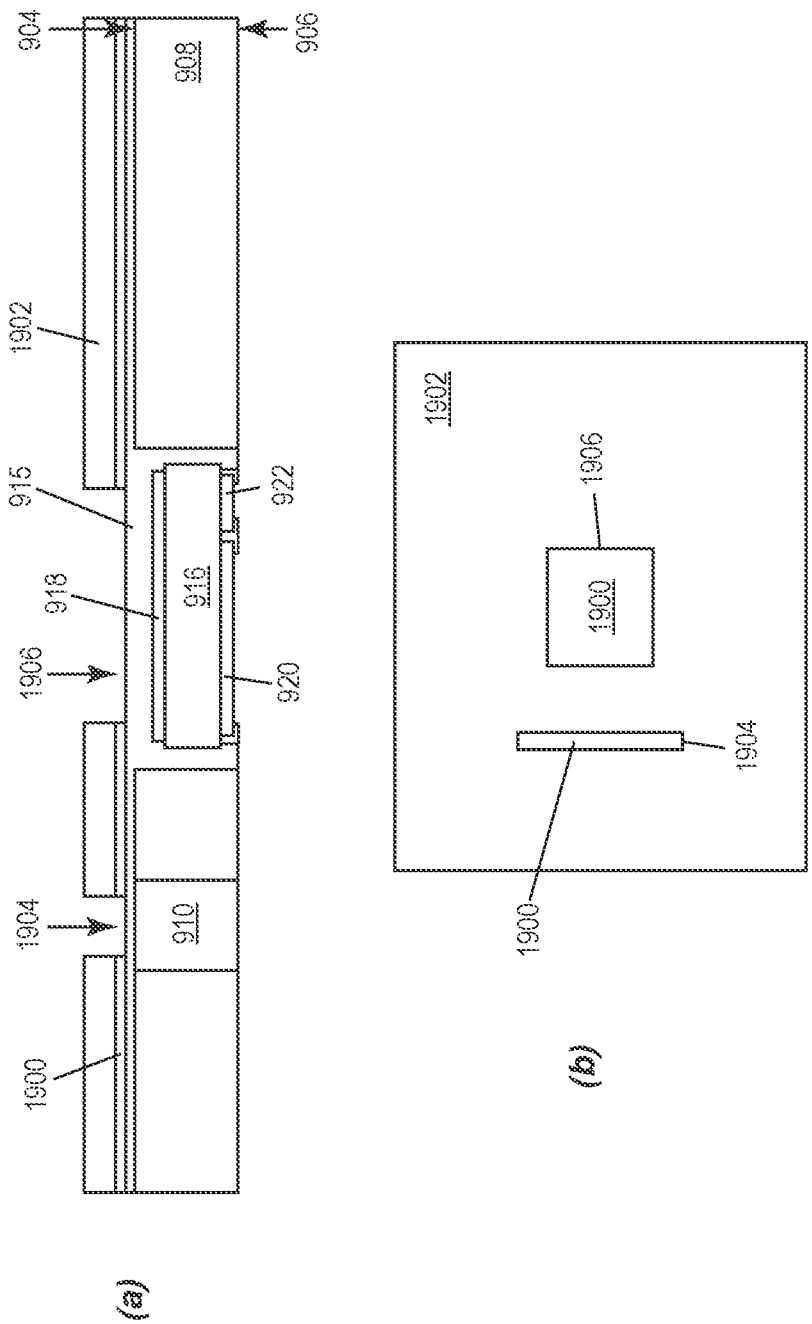

In FIG. 19C, the first and second openings 1904, 1906 in the photoresist 1902 are transferred to the underlying mask 1900, e.g., by etching where the etch chemistry depends on the material of the mask 1900. The mask 1900 now has the first opening 1904 aligned with the first via 910 and the second opening 1906 aligned with the first load terminal bond pad 918 of the power semiconductor die 916.

Figure 19D:
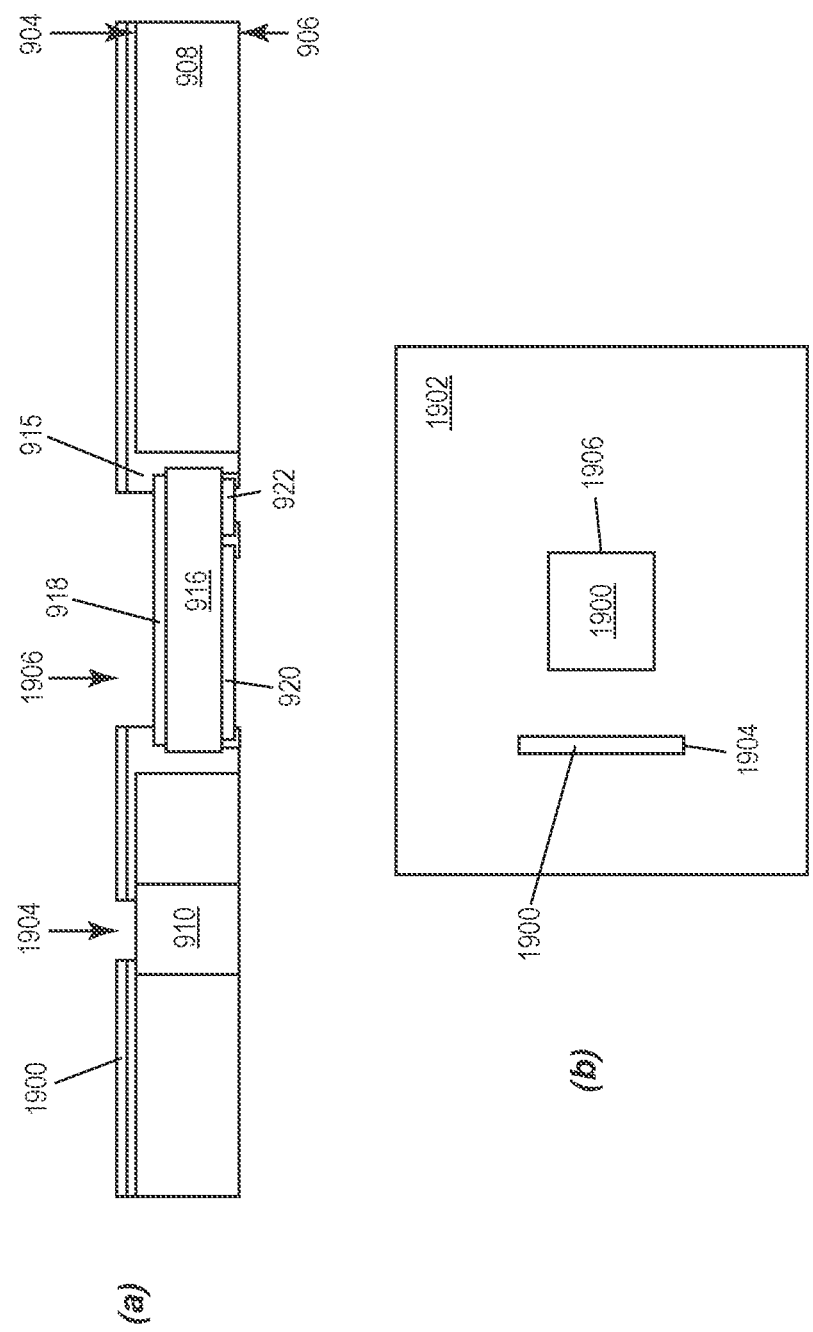

In FIG. 19D, the photoresist 1902 is removed and the resin 915 is etched through the first opening 1904 to expose the first via 910 and through the second opening 1906 to expose the first load terminal bond pad 918 of the power semiconductor die 916. After the etching of the resin 915, the sputtered layer 1900 may be removed from the thinned resin 915. The exposed first via 910 and the exposed first load terminal bond pad 918 of the power semiconductor die 916 may be plated, e.g., with Cu, to connect the first load terminal bond pad 918 of the die 916 to the first via 910 at the first side 904 of the core 908. The first via 910 and the bond pads 920, 922 at the other side of the power semiconductor die 916 also may be plated, e.g., with Cu, to form respective contact pads at the second side 906 of the core 908, e.g., as shown in FIG. 9.

Although the present disclosure is not so limited, the following numbered examples demonstrate one or more aspects of the disclosure.

Example 1. A semiconductor package, comprising: an insulating substrate having a first main side and a second main side opposite the first main side; a power semiconductor die embedded in, and thinner than or a same thickness as, the insulating substrate, the power semiconductor die comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; electrically conductive first vias extending through the insulating substrate in a periphery region which laterally surrounds the power semiconductor die; a first metallization connecting the first load terminal bond pad of the power semiconductor die to the first vias at the first main side of the insulating substrate; solderable first contact pads at the second main side of the insulating substrate and formed by the first vias; and a solderable second contact pad at the second main side of the insulating substrate and formed by the second load terminal bond pad of the power semiconductor die.

Example 2. The semiconductor package of example 1, wherein the control terminal bond pad is at the second side of the power semiconductor die, the semiconductor package further comprising: a solderable third contact pad at the second main side of the insulating substrate and formed by the control terminal bond pad of the power semiconductor die.

Example 3. The semiconductor package of example 1, wherein the control terminal bond pad is at the first side of the power semiconductor die, the semiconductor package further comprising: an electrically conductive second via extending through the insulating substrate in the periphery region; a second metallization connecting the control terminal bond pad of the power semiconductor die to the second via at the first main side of the insulating substrate; and a solderable third contact pad at the second main side of the insulating substrate and formed by the second via.

Example 4. The semiconductor package of any of examples 1 through 3, wherein the insulating substrate comprises a first material in which the power semiconductor die is embedded and a second material different than the first material and which forms the periphery region.

Example 5. The semiconductor package of any of examples 1 through 4, wherein the first vias, the first metallization, and the first load terminal bond pad of the power semiconductor die each comprise copper.

Example 6. The semiconductor package of any of examples 1 through 3, wherein the solderable second contact pad is coplanar with the solderable first contact pads at the second main side of the insulating substrate.

Example 7. The semiconductor package of any of examples 1 through 3, further comprising: a solder mask at least partly covering the first metallization at the first main side of the insulating substrate.

Example 8. The semiconductor package of example 7, wherein the solder mask covers the entire first main side of the insulating substrate.

Example 9. The semiconductor package of any of examples 1 through 3, further comprising: a heat sink attached to the first metallization at the first main side of the insulating substrate.

Example 10. The semiconductor package of any of examples 1 through 3, further comprising: an additional power semiconductor die embedded in, and thinner than or a same thickness as, the insulating substrate, the additional power semiconductor die comprising a first load terminal bond pad at a first side which faces a same direction as the second main side of the insulating substrate, a second load terminal bond pad at a second side which faces a same direction as the first main side of the insulating substrate, and a control terminal bond pad at the first side or the second side; and a solderable additional contact pad at the second main side of the insulating substrate and formed by the first load terminal bond pad of the additional power semiconductor die, wherein the first metallization connects the first load terminal bond pad of the power semiconductor die to the second load terminal bond pad of the additional power semiconductor die in a half bridge configuration at the first main side of the insulating substrate.

Example 11. A method of producing a semiconductor package, the method comprising: embedding a power semiconductor die in an insulating substrate, the insulating substrate having a first main side and a second main side opposite the first main side, the power semiconductor die being thinner than or a same thickness as the insulating substrate and comprising a first load terminal bond pad at a first side which faces a same direction as the first main side of the insulating substrate, a second load terminal bond pad at a second side which faces a same direction as the second main side of the insulating substrate, and a control terminal bond pad at the first side or the second side; and forming a first metallization at the first main side of the insulating substrate, the first metallization connecting the first load terminal bond pad of the power semiconductor die to electrically conductive first vias which extend through the insulating substrate in a periphery region which laterally surrounds the power semiconductor die, wherein the first vias form solderable first contact pads at the second main side of the insulating substrate, wherein the second load terminal bond pad of the power semiconductor die forms a solderable second contact pad at the second main side of the insulating substrate.

Example 12. The method of example 11, wherein forming the first metallization comprises: forming a solder mask on the first main side of the insulating substrate, the solder mask having an opening which exposes at least part of the first load terminal bond pad of the power semiconductor die and exposes at least part of the first vias; and depositing copper in the opening of the solder mask.

Example 13. The method of example 12, wherein the control terminal bond pad is at the second side of the power semiconductor die, and wherein the control terminal bond pad of the power semiconductor die forms a solderable third contact pad at the second main side of the insulating substrate.

Example 14. The method of example 12, wherein the control terminal bond pad is at the first side of the power semiconductor die, wherein an electrically conductive second via extends through the insulating substrate in the periphery region and forms a solderable third contact pad at the second main side of the insulating substrate, the method further comprising: forming a second metallization at the first main side of the insulating substrate, the second metallization connecting the control terminal bond pad of the power semiconductor die to the second via at the first main side of the insulating substrate.

Example 15. The method of any of examples 11 through 14, further comprising: embedding an additional power semiconductor die in the insulating substrate, the additional power semiconductor die being thinner than or a same thickness as the insulating substrate and comprising a first load terminal bond pad at a first side which faces a same direction as the second main side of the insulating substrate, a second load terminal bond pad at a second side which faces a same direction as the first main side of the insulating substrate, and a control terminal bond pad at the first side or the second side, wherein the first load terminal bond pad of the additional power semiconductor die forms a solderable additional contact pad at the second main side of the insulating substrate, wherein the first metallization connects the first load terminal bond pad of the power semiconductor die to the second load terminal bond pad of the additional power semiconductor die in a half bridge configuration at the first main side of the insulating substrate.

Example 16. The method of any of examples 11 through 15, wherein embedding the power semiconductor die in the insulating substrate comprises: adhering the insulating substrate to a temporary bonding tape at the second main side of the insulating substrate; inserting the power semiconductor die in an opening of the insulating substrate such that the power semiconductor die adheres to the temporary bonding tape at the second side of the power semiconductor die; and after inserting the power semiconductor die in the opening of the insulating substrate, filling the opening and covering the power semiconductor die with a resin film.

Example 17. The method of example 16, further comprising: after filling the opening and covering the power semiconductor die with the resin film, removing the temporary bonding tape; planarizing the resin film at the first main side of the insulating substrate; and removing the resin film from at least part of the first load terminal bond pad at the first side of the power semiconductor die.

Example 18. The method of example 17, wherein forming the first metallization at the first main side of the insulating substrate comprises: forming a seed layer on the first main side of the insulating substrate and on the part of the first load terminal bond pad of the power semiconductor die exposed by removing the resin film; plating copper on the seed layer; and patterning the plated copper to define the first metallization.

Example 19. The method of any of examples 11 through 18, further comprising: adhering an additional insulating substrate to an opposite side of the temporary bonding tape as the insulating substrate, or to a temporary carrier interposed between the insulating substrate and the additional insulating substrate; inserting an additional power semiconductor die in an opening of the additional insulating substrate such that the additional power semiconductor die adheres to the temporary bonding tape or to the temporary carrier; and after inserting the additional power semiconductor die in the opening of the additional insulating substrate, filling the opening of the additional insulating substrate and covering the additional power semiconductor die with an additional resin film.

Example 20. A method of producing a plurality of semiconductor packages, the method comprising: adhering a core insulating panel having a plurality of openings to a temporary bonding tape at a second main side of the core insulating panel opposite a first main side; inserting a power semiconductor die in each opening of the core insulating panel, each power semiconductor die being thinner than or a same thickness as the core insulating panel and comprising a first load terminal bond pad at a first side which faces a same direction as the first main side of the core insulating panel, a second load terminal bond pad at a second side which faces a same direction as the second main side of the core insulating panel, and a control terminal bond pad at the first side or the second side, wherein each power semiconductor die adheres to the temporary bonding tape at the second side of the power semiconductor die; forming a first metallization layer at the first main side of the core insulating panel, the first metallization layer being patterned into a plurality of first metallizations, each first metallization being associated with one of the power semiconductor dies and connecting the first load terminal bond pad of the power semiconductor die to respective electrically conductive first vias which extend through the core insulating panel in a periphery region which laterally surrounds the power semiconductor die; and singulating the core insulating panel into a plurality of packages, wherein for each package the first vias included in the package form solderable first contact pads at the second main side of the singulated core insulating panel and the second load terminal bond pad of the power semiconductor die included in the package forms a solderable second contact pad at the second main side of the singulated core insulating panel.

Example 21. A semiconductor package, comprising: a substrate having a first main surface, a second main surface opposite the first main surface, an electrically insulating core between the first and second main surfaces, and an electrically conductive first via extending through a periphery region of the core, the periphery region defining an opening in the core; a power semiconductor die embedded in the opening in the core, the power semiconductor die being thinner than or a same thickness as the core, the power semiconductor die comprising a first load terminal bond pad at a first side which faces a same direction as the first main surface of the substrate, a second load terminal bond pad at a second side which faces a same direction as the second main surface of the substrate, and a control terminal bond pad at the first side or the second side; a plated first contact pad at the second main surface of the substrate and provided by the first via; a plated second contact pad at the second main surface of the substrate and provided by the second load terminal bond pad of the power semiconductor die; and a thermal capacitor attached to the first main surface of the substrate, the thermal capacitor designed to absorb transient heat pulses from the power semiconductor die and subsequently release the transient heat pulses to a surrounding environment.

Example 22. The semiconductor package of example 21, wherein a thickness of the thermal capacitor is based on a magnitude of the transient heat pulses.

Example 23. The semiconductor package of example 22, wherein the magnitude of the transient heat pulses is in a range of 5 to 25 Joules, and wherein the thickness of the thermal capacitor is in a range of 500 to 2500 µm.

Example 24. The semiconductor package of any of examples 21 through 23, wherein a first metallization at the first main surface of the substrate electrically connects the first load terminal bond pad of the power semiconductor die to the first via, and wherein the thermal capacitor is attached to the first metallization or to a plated surface of the first metallization.

Example 25. The semiconductor package of any of examples 21 through 24, wherein the thermal capacitor is attached to the first via and to the first load terminal bond pad of the power semiconductor die, and wherein the thermal capacitor electrically connects the first load terminal bond pad to the first via.

Example 26. The semiconductor package of any of examples 21 through 25, wherein the thermal capacitor has lateral dimensions that are less than the lateral dimensions of the core such that a border of the thermal capacitor is spaced inward from a border of the core.

Example 27. The semiconductor package of any of examples 21 through 26, wherein the thermal capacitor is attached to the first main surface of the substrate by solder, and wherein a border of the thermal capacitor has a protrusion that prevents the solder from reaching a surface of the thermal capacitor that faces away from the substrate.

Example 28. The semiconductor package of any of examples 21 through 27, wherein a surface of the thermal capacitor that faces away from the substrate is structured to increase surface contact with the surrounding environment.

Example 29. A method of batch producing a plurality of semiconductor packages, the method comprising: aligning a first panel with a second panel, the first panel including a plurality of interconnected substrates with openings and a power semiconductor die embedded in each opening, the second panel comprising a plurality of interconnected thermal capacitors aligned with respective ones of the substrates; attaching each thermal capacitor to the corresponding substrate aligned with the thermal capacitor by an attach material applied to the substrates of the first panel and/or the thermal capacitors of the second panel; and after the attaching, cutting through regions of the first panel which interconnect the substrates and through regions of the second panel which interconnect the thermal capacitors to form individual packages, each individual package comprising a substrate, a power semiconductor die embedded in the substrate and a thermal capacitor attached to the substrate, the thermal capacitor being designed to absorb transient heat pulses from the power semiconductor die included in the same package as the thermal capacitor and subsequently release the transient heat pulses to a surrounding environment.

Example 30. A semiconductor package, comprising: an electrically insulating core having a first side, a second side opposite the first side and configured for mounting to another substrate, and an electrically conductive first via extending through a periphery region of the core, the periphery region defining an opening in the core, the core comprising glass fibres interwoven with epoxy material, the core having one or more regions at the second side where the glass fibres are exposed from the epoxy material; a power semiconductor die embedded in the opening in the core, the power semiconductor die being thinner than the core and comprising a first load terminal bond pad at a first side which faces a same direction as the first side of the core, a second load terminal bond pad at a second side which faces a same direction as the second side of the core, and a control terminal bond pad at the first side or the second side of the power semiconductor die; a resin filling the opening in the core and encasing the power semiconductor die; a plated first contact pad at the first side of the core and provided by the first via; a plated second contact pad at the second side of the core and provided by the first load terminal bond pad of the power semiconductor die; and a solder mask partly covering the one or more regions at the second side of the core where the glass fibres are exposed from the epoxy material.

Example 31. A method of producing a semiconductor package, the method comprising: positioning an electrically insulating core with a first side of the core facing downward and a second side of the core facing upward, the second side configured for mounting to another substrate, wherein an electrically conductive first via extends through a periphery region of the core, the periphery region defining an opening in the core, wherein the core comprises glass fibres interwoven with epoxy material; placing a power semiconductor die in the opening in the core, the power semiconductor die being thinner than the core and comprising a first load terminal bond pad facing downward in the same direction as the first side of the core, and a second load terminal bond pad facing upward in the same direction as the second side of the core; at the second side of the core: filling the opening in the core with a resin that encases the power semiconductor die; reducing a thickness of the resin in a region overlying the second load terminal bond pad of the power semiconductor die; and after the reducing, thinning the resin to expose the first via and the second load terminal bond pad of the power semiconductor die, the thinning exposing the glass fibres from the epoxy material in one or more regions at the second side of the core; and partly covering, with a solder mask, the one or more regions at the second side of the core where the glass fibres are exposed from the epoxy material.

Example 32. The method of example 31, wherein reducing the thickness of the resin in the region overlying the second load terminal bond pad of the power semiconductor die comprises: laser etching of the region of the resin overlying the second load terminal bond pad of the power semiconductor die at the second side of the core.

Example 33. The method of example 31 or 32, wherein thinning the resin at the second side of the core to expose the first via and the second load terminal bond pad of the power semiconductor die comprises: plasma etching of the resin at the second side of the core.

Example 34. The method of any of examples 31 through 33, further comprising: plating the first via at the second side of the core to form a plated first contact pad at the second side of the core.

Example 35. The method of example 34, further comprising: plating the second load terminal bond pad of the power semiconductor die to form a plated second contact pad at the second side of the core.

Example 36. The method of any of examples 31 through 35, further comprising: plating an unmasked region at the first side of the core to form a metallization that electrically connects the first load terminal bond pad of the power semiconductor die to the via at the first side of the core.

Example 37. A method of producing a semiconductor package, the method comprising: positioning an electrically insulating core with a first side of the core facing upward and a second side of the core facing downward, the second side configured for mounting to another substrate, wherein an electrically conductive first via extends through a periphery region of the core, the periphery region defining an opening in the core, wherein the core comprises glass fibres interwoven with epoxy material; placing a power semiconductor die in the opening in the core, the power semiconductor die being thinner than the core and comprising a first load terminal bond pad facing upward in the same direction as the first side of the core, and a second load terminal bond pad facing downward in the same direction as the second side of the core; and at the first side of the core: filling the opening in the core with a resin that encases the power semiconductor die; thinning the resin; forming a mask on the thinned resin, the mask having a first opening aligned with the first via and a second opening aligned with the first load terminal bond pad of the power semiconductor die; etching the resin through the first opening to expose the first via and through the second opening to expose the first load terminal bond pad of the power semiconductor die.

Example 38. The method of example 37, wherein forming the mask on the thinned resin comprises: sputtering a layer on the thinned resin; and forming a photoresist on the sputtered layer, the photoresist having the first opening and the second opening.

Example 39. The method of example 38, further comprising: after the etching of the resin, removing the sputtered layer from the thinned resin.

Example 40. The method of any of examples 37 through 39, wherein thinning the resin comprises: completely removing the resin from the first side of the core so that only a thinned region of resin remains over the first load terminal bond pad of the power semiconductor die.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor package, comprising:
   a substrate having a first main surface, a second main surface opposite the first main surface, an electrically insulating core between the first and second main surfaces, and an electrically conductive first via extending through a periphery region of the core, the periphery region defining an opening in the core;
   a power semiconductor die embedded in the opening in the core, the power semiconductor die being thinner than or a same thickness as the core, the power semiconductor die comprising a first load terminal bond pad at a first side which faces a same direction as the first main surface of the substrate, a second load terminal bond pad at a second side which faces a same direction as the second main surface of the substrate, and a control terminal bond pad at the first side or the second side;
   a plated first contact pad at the second main surface of the substrate and provided by the first via;
   a plated second contact pad at the second main surface of the substrate and provided by the second load terminal bond pad of the power semiconductor die; and
   a thermal capacitor attached to the first main surface of the substrate, the thermal capacitor designed to absorb transient heat pulses from the power semiconductor die and subsequently release the transient heat pulses to a surrounding environment.

2. The semiconductor package of claim 1, wherein a thickness of the thermal capacitor is based on a magnitude of the transient heat pulses.

3. The semiconductor package of claim 2, wherein the magnitude of the transient heat pulses is in a range of 5 to 25 Joules, and wherein the thickness of the thermal capacitor is in a range of 500 to 2500 µm.

4. The semiconductor package of claim 1, wherein a first metallization at the first main surface of the substrate electrically connects the first load terminal bond pad of the power semiconductor die to the first via, and wherein the thermal capacitor is attached to the first metallization or to a plated surface of the first metallization.

5. The semiconductor package of claim 1, wherein the thermal capacitor is attached to the first via and to the first load terminal bond pad of the power semiconductor die, and wherein the thermal capacitor electrically connects the first load terminal bond pad to the first via.

6. The semiconductor package of claim 1, wherein the thermal capacitor has lateral dimensions that are less than the lateral dimensions of the core such that a border of the thermal capacitor is spaced inward from a border of the core.

7. The semiconductor package of claim 1, wherein the thermal capacitor is attached to the first main surface of the substrate by solder, and wherein a border of the thermal capacitor has a protrusion that prevents the solder from reaching a surface of the thermal capacitor that faces away from the substrate.

8. The semiconductor package of claim 1, wherein a surface of the thermal capacitor that faces away from the substrate is structured to increase surface contact with the surrounding environment.

* * * * *